(12) United States Patent
Yamaguchi

(10) Patent No.: US 10,606,148 B2
(45) Date of Patent: Mar. 31, 2020

(54) OPTICAL LOW-PASS FILTER AND IMAGING APPARATUS

(71) Applicant: CANON KABUSHIKI KAISHA, Tokyo (JP)

(72) Inventor: Yutaka Yamaguchi, Sakura (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/052,499

(22) Filed: Aug. 1, 2018

(65) Prior Publication Data

US 2019/0049820 A1 Feb. 14, 2019

(30) Foreign Application Priority Data

Aug. 10, 2017 (JP) ................. 2017-155673
Jul. 12, 2018 (JP) ................. 2018-132675

(51) Int. Cl.

| G02B 27/09 | (2006.01) |
|---|---|
| G03B 11/00 | (2006.01) |
| H01L 27/146 | (2006.01) |
| H04N 5/225 | (2006.01) |
| G02B 27/46 | (2006.01) |
| G02B 5/30 | (2006.01) |
| G02B 27/10 | (2006.01) |
| G02B 27/28 | (2006.01) |
| G02B 5/20 | (2006.01) |

(52) U.S. Cl.
CPC ............ *G03B 11/00* (2013.01); *G02B 5/3083* (2013.01); *G02B 27/0905* (2013.01); *G02B 27/106* (2013.01); *G02B 27/283* (2013.01); *G02B 27/46* (2013.01); *H01L 27/14625* (2013.01); *H04N 5/2254* (2013.01); *G02B 5/20* (2013.01)

(58) Field of Classification Search
CPC ............. G02B 5/3083; G02B 27/0905; G02B 27/106; G02B 27/46; G03B 11/00; H01L 27/14625; H04N 5/2254
See application file for complete search history.

(56) References Cited

U.S. PATENT DOCUMENTS

| 5,471,343 A | 11/1995 | Takasugi |
| 2001/0010594 A1 | 8/2001 | Oono |
| 2007/0121042 A1* | 5/2007 | Shogaki ............... G02B 5/3083 349/117 |
| 2011/0149386 A1 | 6/2011 | Yabumoto |
| 2015/0301238 A1* | 10/2015 | Momoki ............... G02B 27/46 348/360 |

FOREIGN PATENT DOCUMENTS

| JP | 5212044 B2 | 6/2013 |
| JP | 2015-046744 A | 3/2015 |
| JP | 2015-213306 A | 11/2015 |

* cited by examiner

*Primary Examiner* — Dung A. Le
(74) *Attorney, Agent, or Firm* — Canon U.S.A., Inc. IP Division

(57) ABSTRACT

An optical low-pass filter includes a stack of N (N≥3) optical anisotropic layers each configured to separate an incident ray into a plurality of rays, wherein the following condition is satisfied: Ds≤0.50 Da, where Da [μm] is a total value of ray separation widths of the first to (N−1)th optical anisotropic layers among the N optical anisotropic layers, and Ds [μm] is a distance between a ray having a maximum phase difference and a ray having a minimum phase difference among the rays separated by the first to (N−1)th optical anisotropic layers.

15 Claims, 20 Drawing Sheets

FIG.2
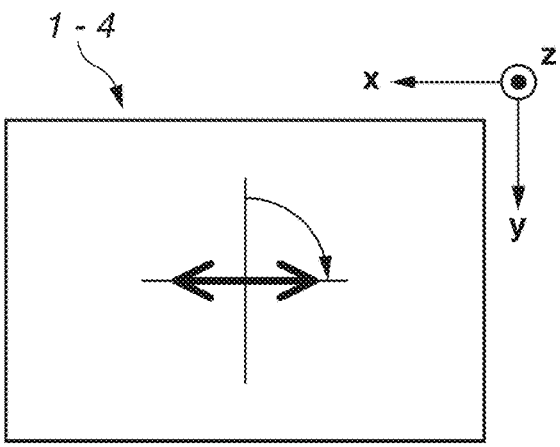
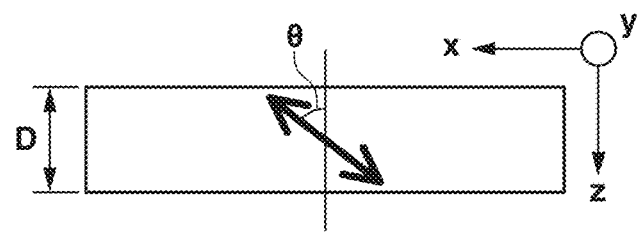
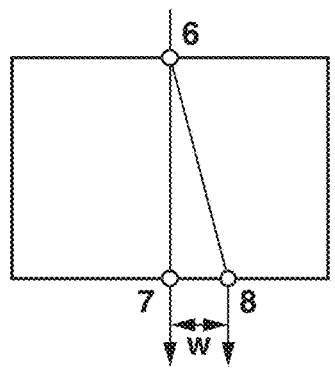
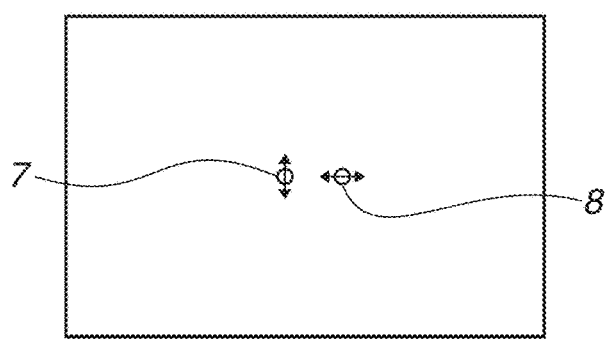

FIG.4
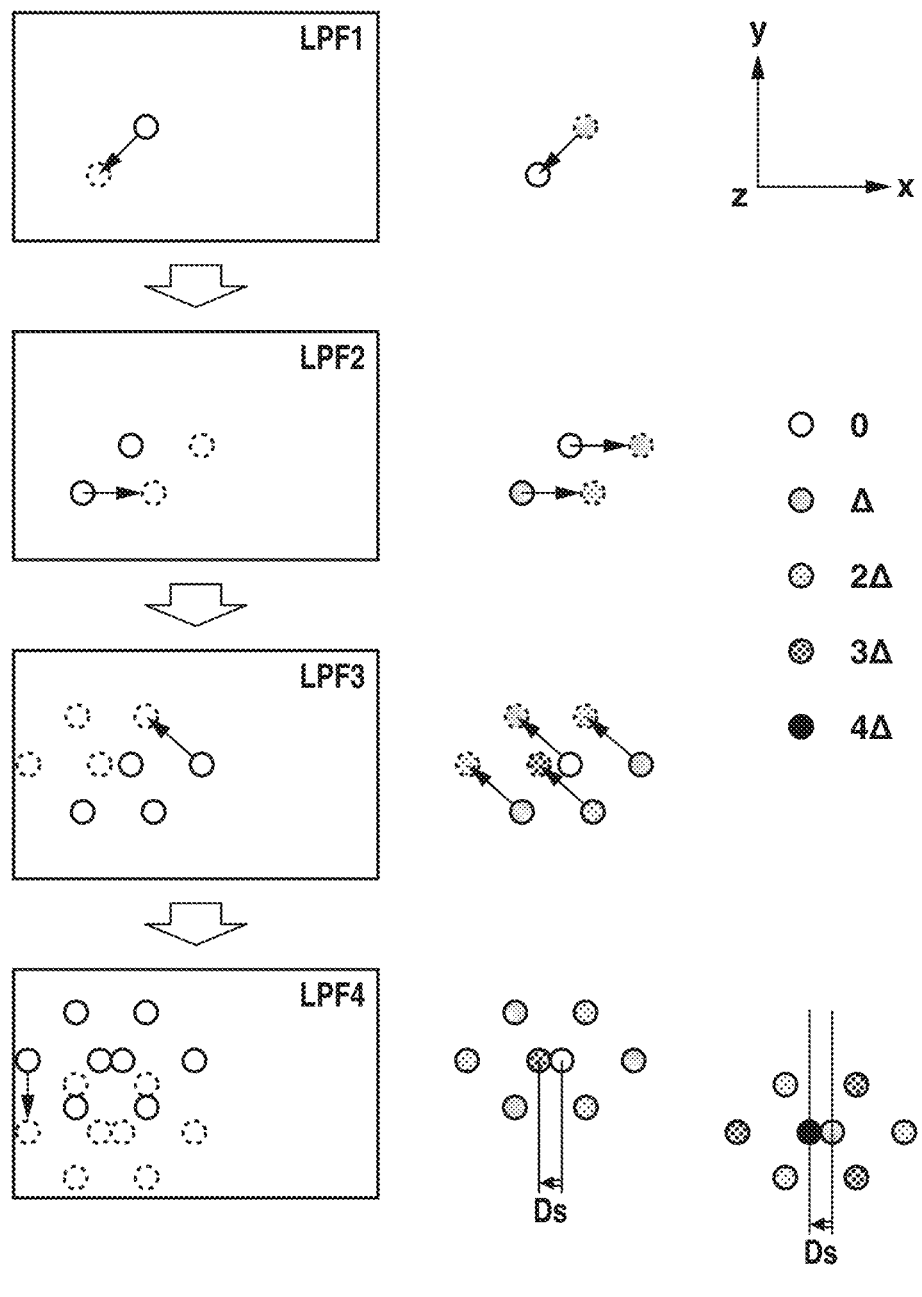
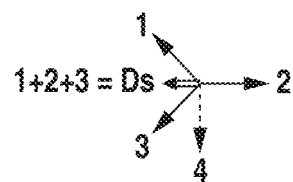

FIG.5
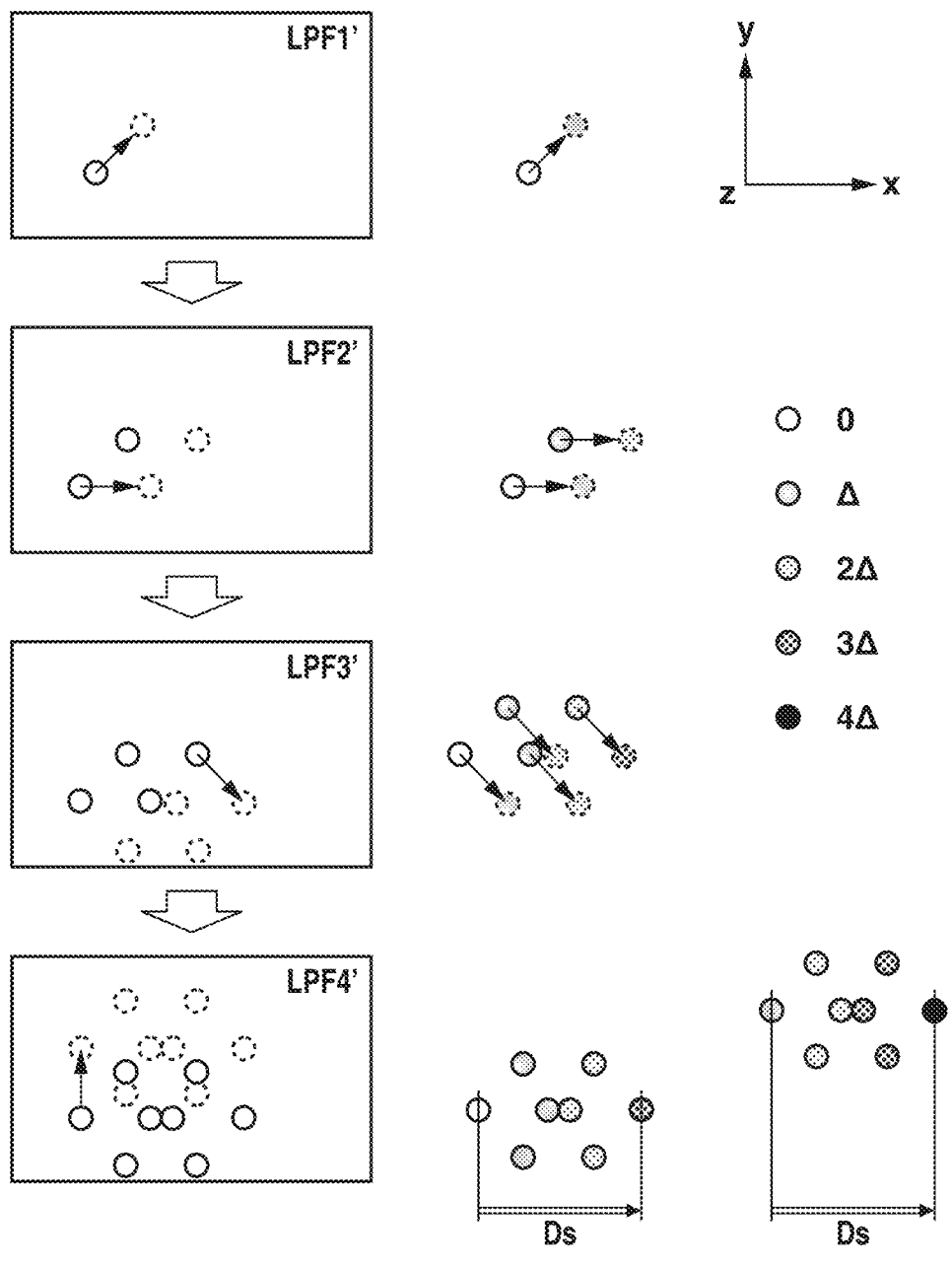
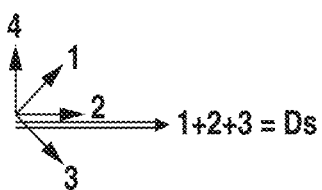

OPTICAL LOW-PASS FILTER AND IMAGING APPARATUS

BACKGROUND OF THE INVENTION

Field of the Invention

The present invention relates to an optical low-pass filter, and more particularly to a multi-point separation optical low-pass filter used in an imaging apparatus.

Description of the Related Art

An imaging apparatus using a two-dimensional image sensor, such as a charge-coupled device (CCD) sensor and a complementary metal-oxide-semiconductor (CMOS) sensor, uses an optical low-pass filter (hereinafter, may be referred to as an optical element) to prevent the occurrence of false color and moiré fringes on an image captured through imaging. The optical low-pass filter limits image information about high frequencies at and above a Nyquist frequency by controlling the point image distribution of focused light.

Japanese Patent Application Laid-Open No. 2015-213306 discusses an optical low-pass filter in which six to eight birefringent optical elements (birefringent layers) are stacked to obtain a point image distribution of Gaussian shape, whereby resolution at high frequencies is enhanced to suppress the occurrence of false color and moiré in oblique directions. Japanese Patent No. 5212044 discusses setting a ray separation width of four- or two-point separation by an optical low-pass filter in consideration of the effect of aberrations and a diffraction limit of an imaging lens.

If the distance (ray separation width) between a plurality of separated point images decreases to near the diffraction limit because of reduced pixel pitches of the image sensor or a multi-point distribution of point images, the shape of the point image distribution changes due to interference between the point images. Japanese Patent Application Laid-Open No. 2015-213306 discusses conditions for forming the point image distribution, but not the effect of phase differences occurring in the birefringent optical elements or the orientations of the separation axes of the respective birefringent optical elements. Japanese Patent No. 5212044 discusses the effect of the spreading of point images due to the diffraction limit, but not that the point image distribution becomes asymmetric because of interference between the point images.

SUMMARY OF THE INVENTION

The present invention is directed to providing an optical low-pass filter having a highly symmetric ray separation function.

According to an aspect of the present invention, an optical low-pass filter includes a stack of N (N≥3) optical anisotropic layers each configured to separate an incident ray into a plurality of rays, wherein the following condition is satisfied:

$$Ds \leq 0.50\, Da,$$

where $Da$ [μm] is a total value of ray separation widths of the first to $(N-1)$th optical anisotropic layers among the N optical anisotropic layers, and $Ds$ [μm] is a distance between a ray having a maximum phase difference and a ray having a minimum phase difference among the rays separated by the first to $(N-1)$th optical anisotropic layers.

Further features of the present invention will become apparent from the following description of exemplary embodiments with reference to the attached drawings.

BRIEF DESCRIPTION OF THE DRAWINGS

FIG. 2 is a diagram for describing point image separation by a birefringent operation element.

FIG. 4 is a diagram for describing a point image distribution and a phase difference distribution of the optical low-pass filter according to the exemplary embodiment.

FIG. 5 is a diagram for describing a point image distribution and a phase difference distribution of an optical low-pass filter that is a representative comparative example.

DESCRIPTION OF THE EMBODIMENTS

Exemplary embodiments of the present invention will be described below with reference to the drawings. Each of the embodiments of the present invention described below can be implemented solely or as a combination of a plurality of the embodiments or features thereof where necessary or where the combination of elements or features from individual embodiments in a single embodiment is beneficial.

Figure 1:
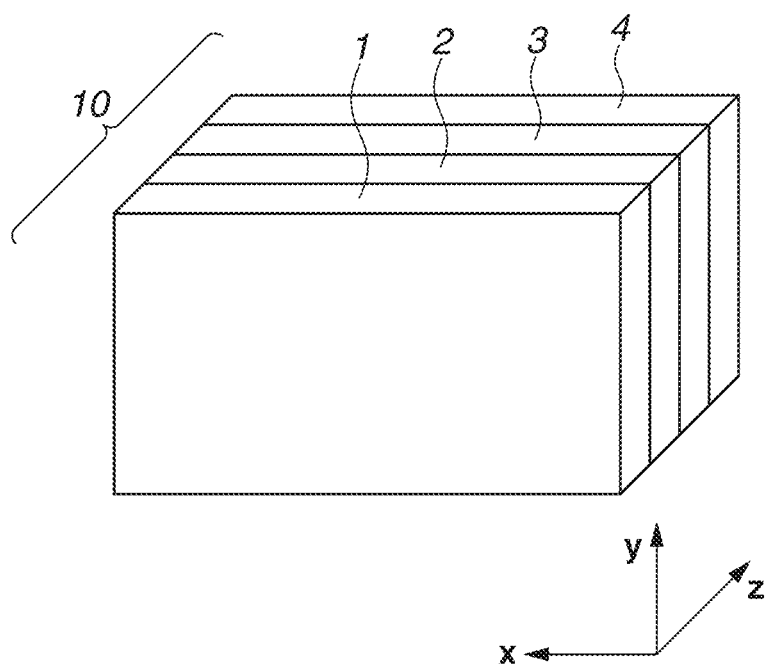
FIG. 1 is a diagram illustrating a configuration of an optical low-pass filter that is a representative exemplary embodiment of the present invention.

FIG. 1 illustrates a configuration of a multilayer (multi-point separation) optical low-pass filter 10 that is a representative exemplary embodiment of the present invention. The optical low-pass filter 10 has a structure in which four layers of birefringent optical elements (birefringent plates) 1 to 4 serving as optical anisotropic elements (optical anisotropic layers) are stacked. The number of optical anisotropic layers is not limited to four. An effect of the present exemplary embodiment can be obtained with three or more optical anisotropic layers.

In the following description, an axis extending in a long-side direction (horizontal direction) of the optical low-pass filter 10 will be referred to as an x-axis, and its direction as an x direction. An axis extending in a short-side direction (vertical direction) of the optical low-pass filter 10 will be referred to as a y-axis, and its direction as a y direction. A plane along the x- and y-axes, i.e., an xy plane will be referred to as an element plane of the optical low-pass filter 10. An axis orthogonal to the element plane will be referred to as an optical axis, and the extending direction of the optical axis as an optical axis direction (z direction). The four birefringent optical elements 1 to 4 are stacked in the optical axis direction.

The optical axis direction is a direction in which light is incident on and transmitted through the optical low-pass filter 10. For the sake of description, each of the birefringent optical elements 1 to 4 is illustrated to be thicker in the optical axis direction than actually is. The actual thickness is approximately several hundreds of micrometers.

The birefringent optical elements 1 to 4 are each made of a uniaxial crystal (anisotropic material), such as rock crystal and lithium niobate. As illustrated in FIG. 2, if each birefringent optical element is seen from the optical axis direction, its optic axis is directed at 90° with respect to the y direction. As illustrated in FIG. 2, if each birefringent optical element is seen from the y direction, its optic axis is tilted by an angle θ with respect to the optical axis direction (90°−θ with respect to the element plane). In the following description, the angle θ will be referred to as a tilt angle. The tilt angle θ is typically set to an angle near 45°. Depending on the material and a phase difference to be set, the tilt angle θ may be set within the range of 10° or more and no more than 80°.

In general, a ray of light incident on a birefringent optical element of parallel plate shape having a tilted optic axis is known to be separated into two rays, a normal ray and an abnormal ray. More specifically, as illustrated in FIG. 2, a ray of light 6 incident on the birefringent optical element in the optical axis direction is separated into a normal ray 7 which is transmitted straight and an abnormal ray 8 which is transmitted in the direction illustrated in the diagram with respect to the normal ray 7. In the following description, the direction in which the normal ray 7 and the abnormal 8 are separated will be referred to a ray separation direction.

The normal ray 7 is polarized so that its electric field oscillates in a direction orthogonal to the ray separation direction. The abnormal ray 8 is polarized so that its electric field oscillates in a direction parallel to the ray separation direction. In other words, the polarization directions of the normal ray 7 and the abnormal ray 8 are orthogonal to each other.

A ray separation width w refers to the distance between the normal ray 7 and the abnormal ray 8 when the rays 7 and 8 are emitted from the birefringent optical element. The ray separation width w is uniquely determined by the magnitude Δn of the anisotropy of refractive index, which is inherent to the material of the birefringent optical element, the tilt angle θ of the optic axis, and the thickness d of the birefringent optical element. If the material and the tilt angle θ are fixed, the ray separation width w is proportional to the thickness d.

If such birefringent optical elements are stacked in the optical axis direction (stacking direction) with their ray separation directions at 45° or 135°, a point image distribution (ray distribution) divided in $2^N$ ways is formed, where N is the number of layers (N≥3). The birefringent optical elements 1 to 4 can be made to function as the optical low-pass filter 10 by geometrically optically designing the spreading of the point image distribution in consideration of the ray separation directions of the birefringent optical elements 1 to 4, the ray separation widths of the birefringent optical elements 1 to 4, and the number of birefringent optical elements 1 to 4 stacked.

If a plurality of point images (rays) is at a close distance, compared to the spreading of the point image distribution itself, there can occur wave-optical interference and the geometrically optically-determined point image distribution may fail to be obtained.

Figure 3:
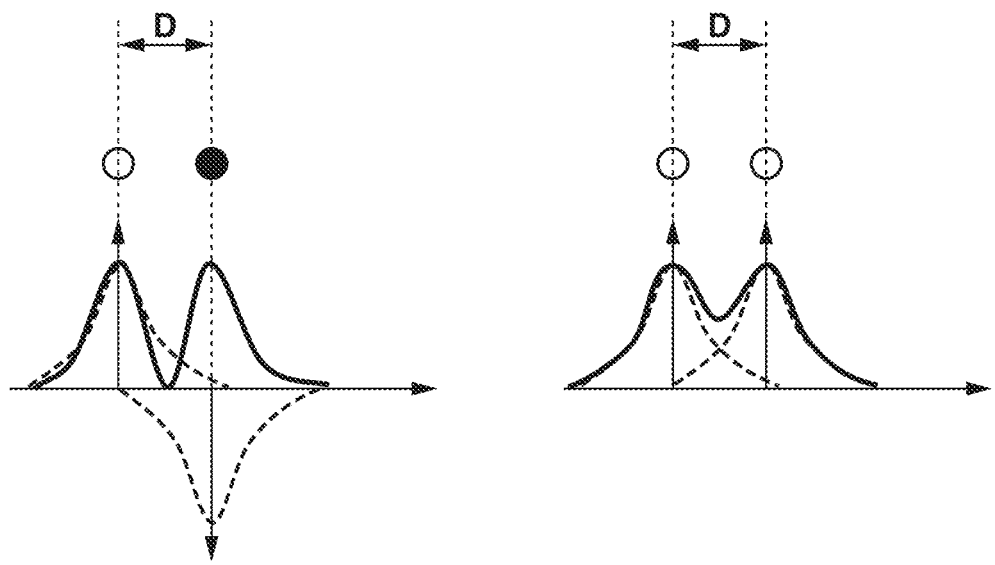
FIG. 3 is a diagram for describing an interference effect between point images.

As a simple example, take, as illustrated in FIG. 3, two point images that are at a distance D and have parallel polarization directions among a plurality of separated point images. The dotted-lined curves in the diagram indicate the original intensity distributions (point image distributions) of the respective point images. The solid-lined curve indicates a combined point image distribution of the two point images. The white and black point images represent different phases. In the left diagram of FIG. 3, the upper and lower dotted-lined curves indicate that the two point images have a phase difference of $(m+1)\lambda/2$. In the right diagram of FIG. 3, the two point images have zero phase difference or a phase difference of an integer multiple of the wavelength. In term of geometrical optics, the point image distribution remains unchanged regardless of the phase difference therebetween the two point images. In fact, the point images have a finite spread due to diffraction and aberration, and interference occurs according to a phase difference between each other's point image distributions.

Specifically, in the left diagram of FIG. 3, a drop occurs between the point images due to mutual cancellation. In the example of the right diagram of FIG. 3, a smooth point image distribution is obtained by mutual intensification. As a result, the point spread function obtained by combining two point images differs between the left and right diagrams. Here, the apparent ray separation width in consideration of interference is smaller in the right diagram than in the left diagram.

In general, point images immediately after separation by a birefringent optical element have an orthogonal polarization relationship as illustrated in FIG. 2 in which the polarization directions of the point images are illustrated by the bidirectional arrows. The point image distribution can thus be obtained by adding the intensity distributions without consideration of the phases. If the separation width between the point images is sufficiently larger than the spreading of the point images due to diffraction and aberration, the impact of the interference is small.

However, a multilayer, i.e., multi-point separation optical low-pass filter is more susceptible to interference because the distances between point images decrease in the process of point image separation. In particular, in a multi-point separation optical low-pass filter that separates a point image into eight or more point images, or more notably 16 or more point images, the point images affect each other in a complicated manner. The configuration of the optical low-pass filter therefore needs to be selected to provide an appropriate point image distribution in consideration of interference due to phase differences between the point images.

To describe the effect of interference in a multi-point separation optical low-pass filter, consider a four-layer optical low-pass filter for 16-point separation as in the one in FIG. 1. FIG. 4 illustrates the separation process of point images in a case where four birefringent optical elements are stacked in the optical axis direction. A birefringent optical element will hereinafter be referred to as an LPF. In FIG. 4, the first to fourth LPFs arranged in order from the light incident side will be referred to as an LPF1, an LPF2, an LPF3, and an LPF4, respectively.

FIG. 4 illustrates how point images are separated when a ray of light is transmitted through the LPF1, LPF2, LPF3, and LPF4 in this order. A solid-lined circle represents a point image of a normal ray. A dotted-lined circle represents a point image of an abnormal ray. An arrow from one point image to another indicates a ray separation direction. As illustrated in FIG. 4, a ray of light incident on the optical low-pass filter (incident ray) is separated in ray separation directions at angles of 225°, 0°, 135°, and 270° to the x-axis by the LPF1 to LPF4, respectively. The incident ray is thereby separated a total of four times to finally form 16 point images.

In FIG. 4, phase differences between the point images are illustrated by different tones beside the LPFs. A phase difference Δ between a normal ray and an abnormal ray occurring in each LPF is the same.

As illustrated in FIG. 4, the transmission of the incident ray through the LPF1 gives the point image of the abnormal ray a phase difference of Δ with respect to the normal ray. When the rays are transmitted through the LPF2, a phase difference distribution 0 to 2Δ is obtained. When the rays are further transmitted through the LPF3, a phase difference distribution 0 to 3Δ is obtained. The rays are finally transmitted through the LPF4 to form a point image distribution of normal rays and abnormal rays. The normal rays and the abnormal rays are orthogonally polarized and therefore do not interfere with each other. Interference between point images according to the phase difference distribution thus occurs in the eight-point point image distribution past the LPF3. Such point image distributions are superposed to form the point images corresponding to 16-point separation.

Now, focus attention on the phase difference distribution in the LPF3 where the effect of interference needs to be taken into account. A point image having a minimum phase difference 0 and a point image having a maximum phase difference 3Δ adjoin or are adjacent near the center, around which three point images having a phase difference of Δ and three point images having a phase difference of 2Δ are symmetrically arranged. The eight point images of the normal rays and the eight point images of the abnormal rays in the LPF4 have relatively the same phase difference distributions. In fact, the two phase difference distributions do not provide the same interference distributions because there are additional phase jumps due to the ray separation directions.

FIG. 5 illustrates an example (comparative example) of an optical low-pass filter that performs 16-point separation with a four-layer configuration similar to but different from that of FIG. 4. In FIG. 5, the first to fourth LPFs will be referred to as an LPF1', an LPF2', an LPF3', and an LPF4', respectively. The ray separation directions of the LPF1' to LPF4' illustrated in FIG. 5 are different from those of the LPF1 to LPF4 illustrated in FIG. 4. As illustrated in FIG. 5, an incident ray incident on the optical low-pass filter is separated in ray separation directions at angles of 45°, 0°, 315°, and 90° to the x-axis by the LPF1' to LPF4', respectively. The incident ray is thus separated a total of four times to finally form 16 point images.

In terms of geometrical optics, the point image distribution obtained from the LPF4' of FIG. 5 is the same as that obtained from the LPF4 of FIG. 4 except a difference in the barycentric position. As in FIG. 4, FIG. 5 illustrates phase differences of the point images beside the LPFs. The phase difference distribution obtained from the LPF3' of FIG. 5 is different from that obtained from the LPF3 of FIG. 4. The leftmost point image has a minimum phase difference of 0. Three point images having a phase difference of Δ and three point images having a phase difference of 2Δ are also formed. The rightmost point image has a maximum phase difference of 3Δ. The resulting phase difference distribution is such that the phase difference increases from the left to the right in the diagram. The phase difference distribution obtained from the LPF3' of FIG. 5 is highly asymmetrical, compared to the phase difference distribution obtained from the LPF3 of FIG. 4.

To describe the symmetricity of the phase difference distributions of the point images, the configuration of the LPF1 to LPF4 of FIG. 4 and that of the LPF1' to LPF4' of FIG. 5 will be expressed by vectors. With the direction of a vector as a ray separation direction and the length of the vector as a ray separation width, the superposition of the LPF1 to LPF4 is illustrated at the bottom of FIG. 4. The superposition of the LPF1' to LPF4' is illustrated at the bottom of FIG. 5.

A combined vector obtained by adding the vectors of the LPF1 to LPF3 or the LPF1' to LPF3', which are layers the phase differences of which is to be taken into consideration, is illustrated by the double-lined arrow. The direction of the combined vector can be regarded as a gradient direction of the entire phase difference distribution of the point images. The length of the combined vector can be regarded as the amount of unevenness of the phase difference distribution. In FIG. 4, the directions of the vectors are less uneven, and the resulting combined vector is short because of mutual cancellation. This can be considered to correspond to the almost uniform phase difference distribution formed by the LPF4 of FIG. 4.

By contrast, the phase difference distribution of FIG. 5 is uneven. The vectors are largely biased to the x direction, and the resulting combined vector is long in the x direction. A comparison between the combined vector illustrated in FIG. 5 and the phase difference distribution obtained from the LPF4' of FIG. 5 shows that the combined vector long in the x direction corresponds to the deviation of the phase difference distribution to the x direction. The configuration of FIG. 4 thus provides a highly symmetric phase difference distribution, compared to the configuration of FIG. 5. The high symmetricity of the phase difference distribution means that the point image distribution can be easily uniformized by wavelength averaging to be described below.

The length of the combined vector is equal to a distance (ray separation width) Ds between the position of the point image having the minimum phase difference and the position of the point image having the maximum phase difference among the point images obtained from the LPF3 or the LPF3'. The reason is that the position where the point image having the maximum phase difference reaches coincides with the terminal point of the combined vector, with the point image having the minimum phase difference as the starting point. The distance Ds can thus be used as an evaluation value for evaluating the symmetricity of the phase differences in the point image distribution. To obtain a uniform point image distribution, it is desirable that the orientations of the optic axes and the ray separation widths of the LPF1 to LPF4 are designed to make the distance Ds sufficiently small.

Specifically, the ray separation width Ds desirably satisfies the following conditional expression (1) with Da:

$$Ds \leq 0.5\, Da, \tag{1}$$

where Da [μm] is a total value (i.e. sum) of the ray separation widths of first to (N−1)th LPFs arranged in order from the light incident side in an optical low-pass filter including N (N≥3) LPFs, and Ds [μm] is a distance between the ray having the maximum phase difference and the ray having the minimum phase difference among the rays separated by the first to (N−1)th optical anisotropic layers.

By satisfying such a condition, an optical low-pass filter that is highly symmetrical in orientation and closer to geometrical optical design values even with the interference effect between point images taken into consideration can be obtained. As a practical guideline in using the optical low-pass filter for an optical system of an imaging apparatus, interference between point images is considered to have a significant impact if Ds is smaller than the width of a diffraction spread of d-line (587 nm) at F5.6, or 4 μm (1.22λdF=4.010 μm). In consideration of manufacturing errors, the conditional expression (1) is desirably satisfied if Ds is 4.2 μm or less (a condition that Ds≤4.2 μm is satisfied) in particular. In fact, image sensors are getting smaller in pixel pitch. If the low-pass filter effect is intended with smaller ray separation widths and brighter F numbers, the impact of the interference between point images on the deformation of the point image distribution is considered to increase even at Ds of 2 μm or so.

An imaging apparatus using an optical low-pass filter typically operates in a broad wavelength band such as the visible light band. Since the phase differences of the LPFs are wavelength-dispersive, the phase difference Δ changes with the wavelength and the distribution of point images varies accordingly. In an actual image captured by the imaging apparatus, the distribution of point images is averaged to form a highly symmetric point image distribution by the sensitivity of the image sensor and the bandwidth of a color filter.

Figure 6:
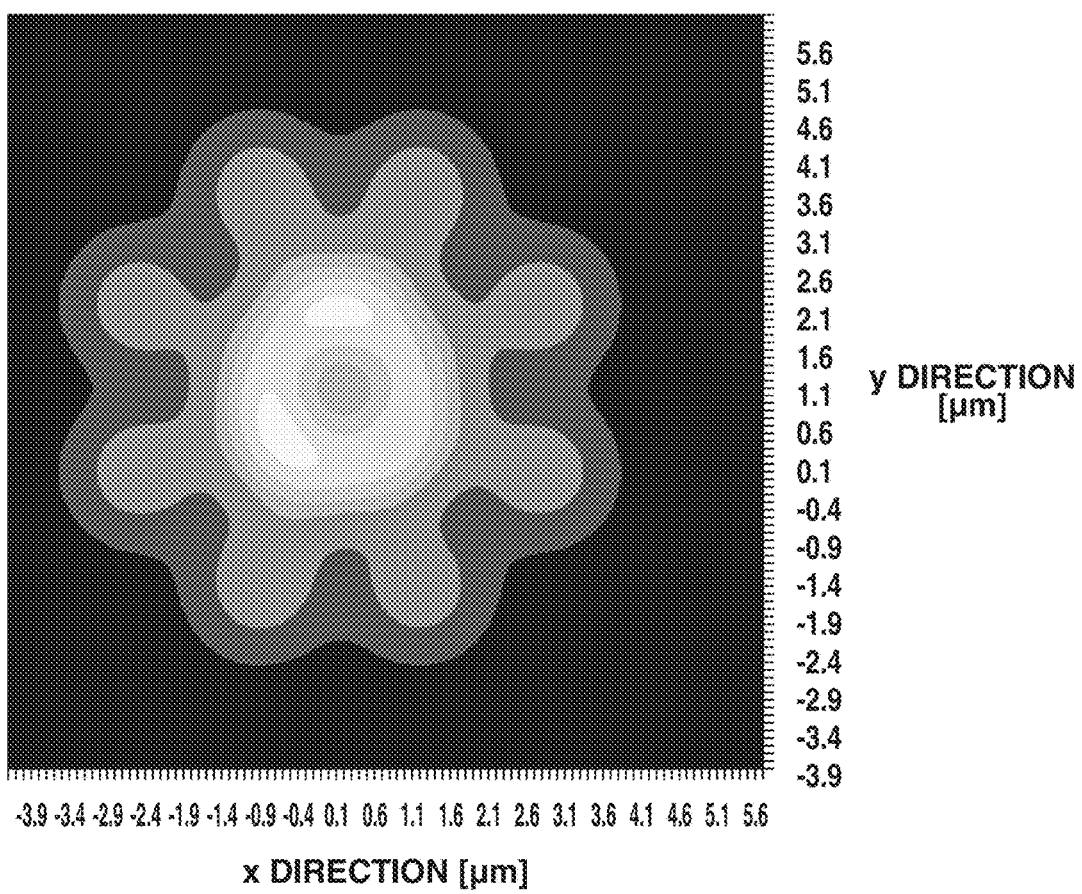
FIG. 6 is a point image distribution diagram of an optical low-pass filter that is a first exemplary embodiment of the present invention.
Figure 7:
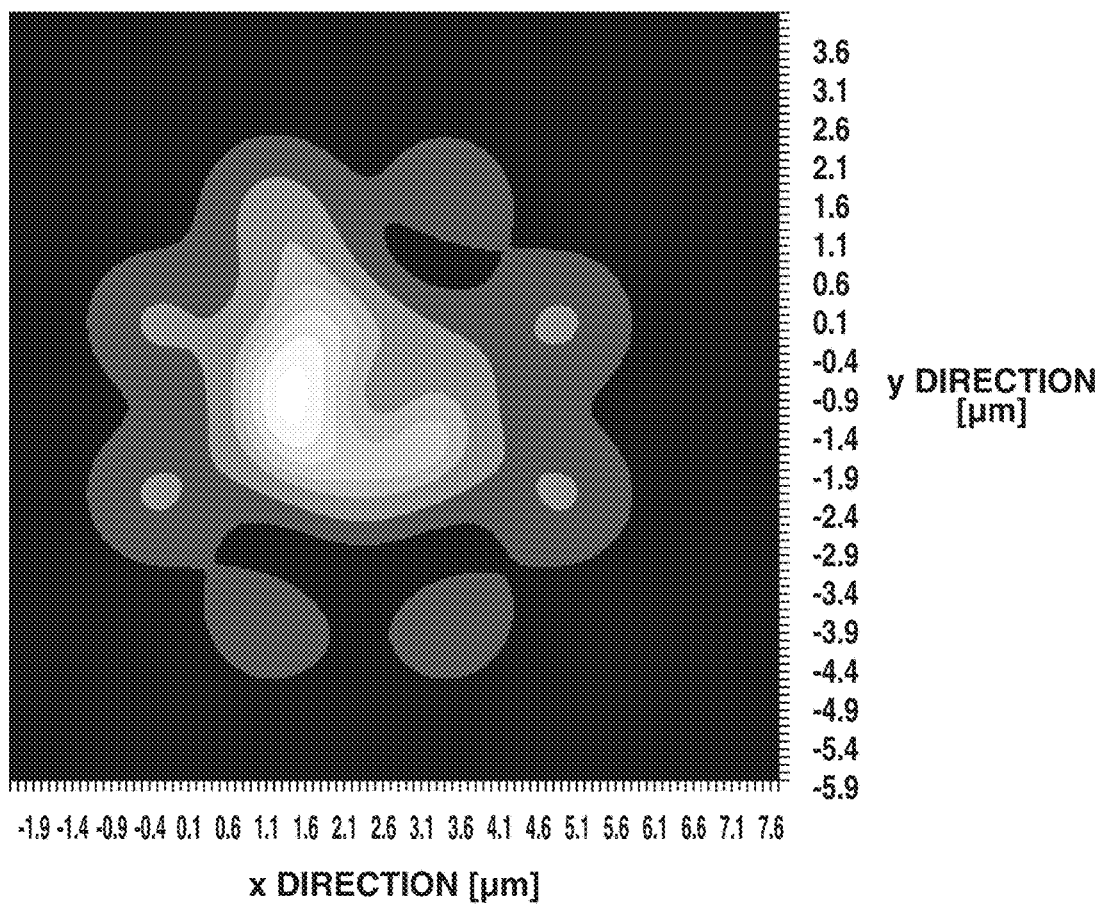
FIG. 7 is a point image distribution diagram of an optical low-pass filter that is a first comparative example.

As an example, FIG. 6 illustrates a point image distribution according to a configuration illustrated in Table 1, averaged in the range of 460 nm to 640 nm in wavelength. Due to the spreading of the point images, the intensity distributions of the point images interfere with each other. The resulting point image distribution is symmetrical even with wavelength averaging taken into account. As a comparative example, FIG. 7 illustrates a point image distribution according to a configuration illustrated in Table 2. In this comparative example, the point image distribution remains asymmetrical even with wavelength averaging taken into account.

A difference between the point image distributions of FIGS. 6 and 7 is ascribable to the distribution of phase differences between the point images. The phase difference distribution of the point images in FIG. 7 is highly uneven, and there remains asymmetricity even with changes by wavelength dispersion taken into account. By contrast, the phase difference distribution of the point images in the point image distribution of FIG. 6 is highly symmetrical, and uniform point images are obtained by wavelength averaging. The ray separation directions of the LPFs can be uniformly distributed by satisfying the conditional expression (1), whereby a uniform point image distribution is obtained.

The following conditional expression (1a) can be further satisfied:

$$Ds \leq 0.4\, Da \tag{1a}$$

For sufficient wavelength averaging in the wavelength range (use wavelength range) in which the optical low-pass filter according to the present exemplary embodiment is used, the LPFs desirably have phase differences with somewhat large wavelength dispersions. With small wavelength dispersions, the wavelength averaging can be insufficient if an incident ray having a single wavelength forms an uneven point image distribution.

Specifically, suppose that the shortest wavelength in the use wavelength range of the optical low-pass filter is λmin, and the longest wavelength is λmax. The following conditional expression (2) is desirably satisfied:

$$0.5 \leq \delta min/\lambda min - \delta max/\lambda max, \tag{2}$$

where δmin and δmax are phase differences occurring in at least one of the first to (N−1)th LPFs at the shortest wavelength λmin and the maximum λmax, respectively.

The following conditional expression (3) is also desirably satisfied:

$$0.5 \leq \delta s/\lambda min - \delta s/\lambda max, \tag{3}$$

where δs is a phase difference occurring in at least one of the N LPFs.

A sufficient wavelength averaging effect can be obtained by satisfying the conditional expression (2) or (3). The use wavelength range is determined by the specifications of the imaging apparatus that uses the optical low-pass filter. For example, if the optical low-pass filter is used on an image sensor, the use wavelength range is set in consideration of the sensitivity of the image sensor and the transmittance of a color filter or a cut filter. Within the visible light spectrum, a range of approximately 400 nm to 700 nm or a wavelength range having an optional wavelength width corresponding to a certain color gamut of around 100 nm therein is selected. An infrared wavelength range or an ultraviolet wavelength range other than the visible light wavelengths may be applicable as long as the wavelength range is set by the imaging apparatus. If a wavelength range to be taken into consideration in operating the optical low-pass filter is assumed to be the use wavelength range, the conditional expression (2) is desirably satisfied to obtain the effect of the present exemplary embodiment. The conditional expression (2) is desirably satisfied by not only one of the first to (N−1)th LPFs but the other LPFs as well.

The following conditional expressions (2a) and (2b) can be satisfied in order:

$$0.5 \leq \delta min/\lambda min - \delta max/\lambda max \leq 3.0, \text{ and} \tag{2a}$$

$$0.6 \leq \delta min/\lambda min - \delta max/\lambda max \leq 2.0 \tag{2b}$$

The following conditional expressions (3a) and (3b) can be further satisfied in order:

$$0.5 \leq \delta s/\lambda min - \delta s/\lambda max \leq 10.0, \text{ and} \tag{3a}$$

$$0.55 \leq \delta s/\lambda min - \delta s/\lambda max \leq 8.5 \tag{3b}$$

In the description above, a configuration for performing point image separation without using a wavelength plate has been described. However, a wavelength plate (λ/4 plate) may be arranged between two adjoining or adjacent LPFs, and the LPFs may be configured to perform point image separation in mutually orthogonal directions. In such a case, the wavelength plate having no point image separation function is used to convert the polarization states and does not substantially contribute to the combined vector. Even in the case where the optic axes of the two LPF are oriented at 90° with respect to each other, a similar concept to that of the combined vector can be applied.

However, the addition of a layer not contributing to point image separation to a multi-point separation optical low-pass filter which is likely to cause interference between point images leads to increased material cost and thickness. Then, the first LPF (first optical anisotropic layer, first anisotropic optical element) which performs point image separation in the x direction (first direction) or y direction (second direction) and the second LPF (second optical anisotropic layer, second anisotropic optical element) which performs point image separation in a direction of 45° or 135° with respect to the x or y direction can be alternately stacked. In such a case, to effectively suppress false color which is likely to occur in diagonal components, the ray separation width of the first LPF is desirably smaller than that of the second LPF.

In the configuration example illustrated in FIG. 4, the four LPFs, or LPF1 to LPF4, having the same ray separation width are used. However, the LPFs may have respective different ray separation widths. That the ray separation width Ds is sufficiently small as expressed by the conditional expression (1) means that the unevenness of the combined vector in the ray separation direction is small regardless of the orientations. A similar effect to that of the configuration of FIG. 4 can thus be obtained even if the LPF1 to LPF4 have respective different ray separation widths.

The basic design values of the optical low-pass filter may be calculated from geometrical optical conditions, even considering interference between point images. A method for determining point image distributions in advance in consideration of the effect of a diffraction spread and interference, and adjusting the magnitudes of the characteristics of the LPFs based on the results can be employed. There is no contradiction between satisfying the conditional expressions (1) and (2) and calculating the design values from geometrical optical conditions. The geometrical optical design values have two degrees of freedom in terms of the ray separation directions of the LPFs (e.g., separation in an orientation of +45° and separation in an orientation of 225° are geometrically optically equivalent). The geometrical optical design values and the conditional expression (1) can thus be independently handled. More specifically, after the geometrical optical design, the ray separation widths of the respective LPFs can be set to satisfy the conditional expression (1) within the degrees of freedom. The same applies to the phase differences concerning the conditional expression (2). For example, the ray separation width of an LPF is determined by using two parameters, the tilt angle θ and the thickness d. Since the parameters are independent of each other, the phase difference can be optionally adjusted for the same ray separation width. The ray separation width and the phase difference can therefore be controlled independent of each other. For example, the ray separation width can usually be maximized by setting the tilt angle θ near 45°. If the thickness d is sufficiently large, the tilt angle θ can be set to a value greater than 45°. The latter can increase the phase difference for the same ray separation width.

Concerning the conditional expression (1), a simpler configuration method will be described. If the N LPFs are configured to have the same ray separation width, the angle formed between the ray separation directions of two adjoining or adjacent LPFs may be set at approximately 135°. An optical low-pass filter satisfying the conditional expression (1) can thereby be implemented. Since the settings of the ray separation widths and the ray separation directions are determined by design conditions, the foregoing angle does not need to be exactly set at 135°. To allow for tolerance and design allowances, the angle may be selected from a range of 120° or more and no more than 150°.

The conditions for obtaining a point image distribution close to design values, uniformized by wavelength averaging has been mainly described, considering interference between point images. To obtain a highly symmetric point image distribution at a single wavelength, not only the foregoing phase differences between the point images but phase jumps occurring from point image separation and the manner of superposition of the point image distributions formed by up to the (N−1)th layer also need to be taken into consideration. In addition, in a case where the conditional expression (1) is satisfied, the conditions about the orientations of the optic axes of the LPFs are determined to some degree. The symmetricity of the point image distribution then needs to be adjusted by using the ray separation direction of the final layer, i.e., Nth LPF and the phase differences Δ occurring in the respective LPFs.

If all the N LPFs have the same ray separation width, the following equation (4) is desirably satisfied:

$$\Delta nd = m \times \lambda a, \quad (4)$$

where λa is a wavelength longer than the shortest wavelength λmin and shorter than the longest wavelength λmax of the use wavelength range, Δnd is the phase difference of at least one of the second to (N−1)th optical anisotropic layers or LPFs (at least one LPF except the first or the Nth), and m is a natural number.

If the foregoing first and second LPFs are alternately stacked and have respective different ray separation widths, the following equation (5) is desirably satisfied:

$$\Delta nd = (m+0.5)/2 \times \lambda a, \quad (5)$$

where λa is the wavelength, and Δnd is the phase difference of at least one LPF except the first or the Nth.

In such a manner, a highly symmetric point image distribution for a specific wavelength can be obtained by controlling the phase differences and the ray separation directions of the LPFs.

The LPFs may be made of various materials. For example, transparent uniaxial anisotropic crystal materials such as rock crystal, sapphire, and lithium niobate may be used. The N LPFs may be made of a combination of such materials. Aside from crystal materials, the LPFs may be constituted by using a liquid crystal or by using structural birefringence.

Now, specific exemplary embodiments (numerical examples) of the foregoing optical low-pass filter will be described.

An optical low-pass filter according to a first exemplary embodiment (first numerical example) of the present invention will be described. Table 1 illustrates a configuration of the optical low-pass filter according to the present exemplary embodiment. As illustrated in FIG. 1, an optical low-pass filter 10 according to the present exemplary embodiment is constituted by stacking LPF1 to LPF4 made of rock crystal in this order in the optical axis direction. As illustrated in Table 1, the LPF1 to LPF4 have a ray separation direction of 225°, 0°, 135°, and 270°, respectively, with respect to the x direction. The LPF1 to LPF4 all have the same ray separation width of 2.10 μm.

The point images of the third LPF3 have a phase difference distribution as illustrated in the third row of FIG. 4. The distance Ds between the point image having the maximum phase difference and the point image having the minimum phase difference is 0.870 µm. This is equivalent to 0.138 Da, which satisfies the conditional expression (1).

A difference between the values of the phase differences occurring in each LPF at the shortest wavelength 460 nm and the longest wavelength 640 nm of the use wavelength range, divided by 460 nm and 640 nm is 1.118. The conditional expression (2) is thus satisfied.

FIG. 6 illustrates a point image intensity distribution of the optical low-pass filter 10 according to the present exemplary embodiment. The point image intensity distribution indicates the distribution at the focal position when a light flux equivalent to F2.0 is incident on the optical low-pass filter 10. The distribution results from wavelength averaging in the range of 460 nm to 640 nm. It can be seen that, although not the same as that of 16-point separation, a point image distribution with less unevenness in any orientation is obtained.

Figure 8:
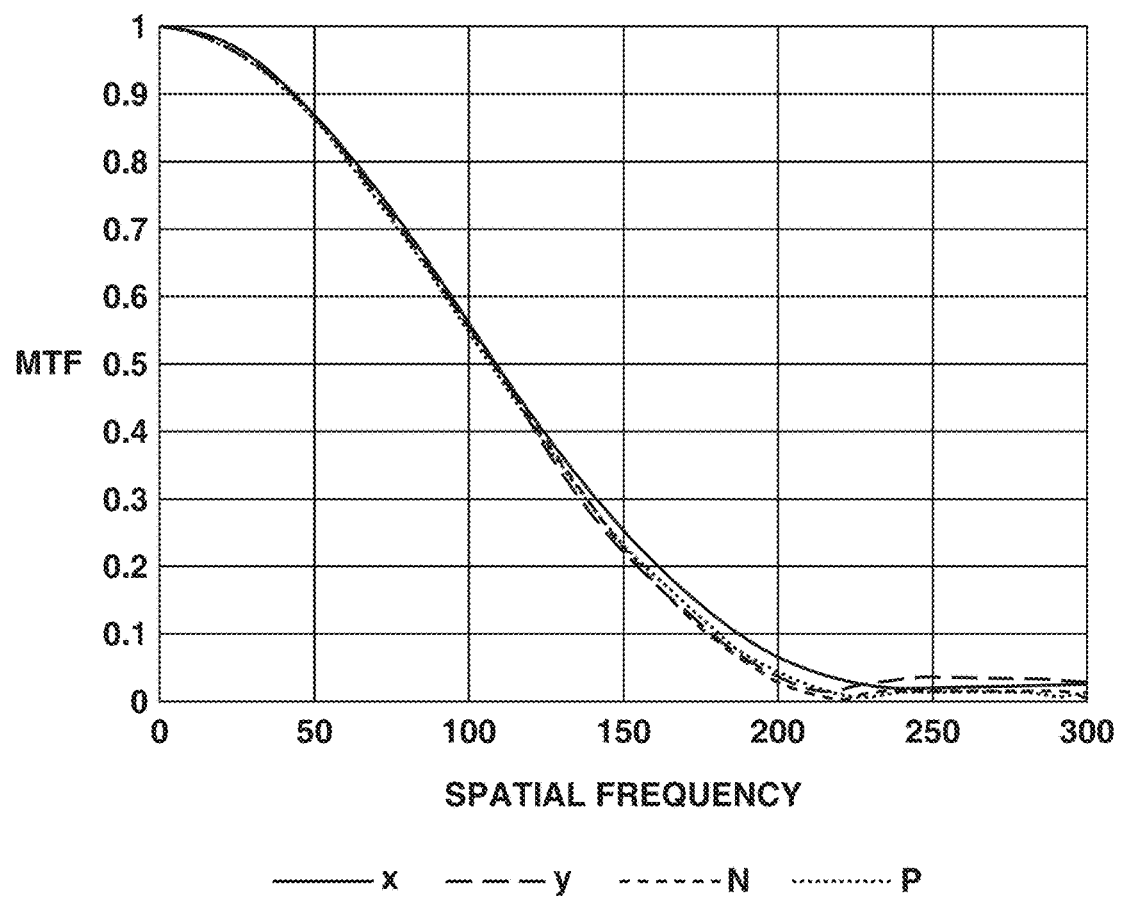
FIG. 8 is a chart illustrating a spatial frequency characteristic of the first exemplary embodiment.

FIG. 8 illustrates a spatial frequency characteristic (modulation transfer function (MTF)) of the point image intensity distribution of FIG. 6. The four lines in FIG. 8 indicate MTFs in the horizontal direction (x), vertical direction (y), +45° direction (P), and −45° direction (N). In the present exemplary embodiment, the MTFs have a symmetric distribution in all directions.

The optical low-pass filter according to the present exemplary embodiment has a Nyquist frequency Fn of approximately 110/mm. Perceived horizontal and vertical resolutions can thus be enhanced with moderate suppression of color moiré occurring in diagonal directions.

Table 2 illustrates a configuration of an optical low-pass filter according to a first comparative example. In this comparative example, the ray separation widths and the phase differences are the same as in the first exemplary embodiment, whereas the ray separation directions are different. The distance Ds is 5.070 µm, which is equivalent to 0.805 Da and does not satisfy the conditional expression (1).

Figure 9:
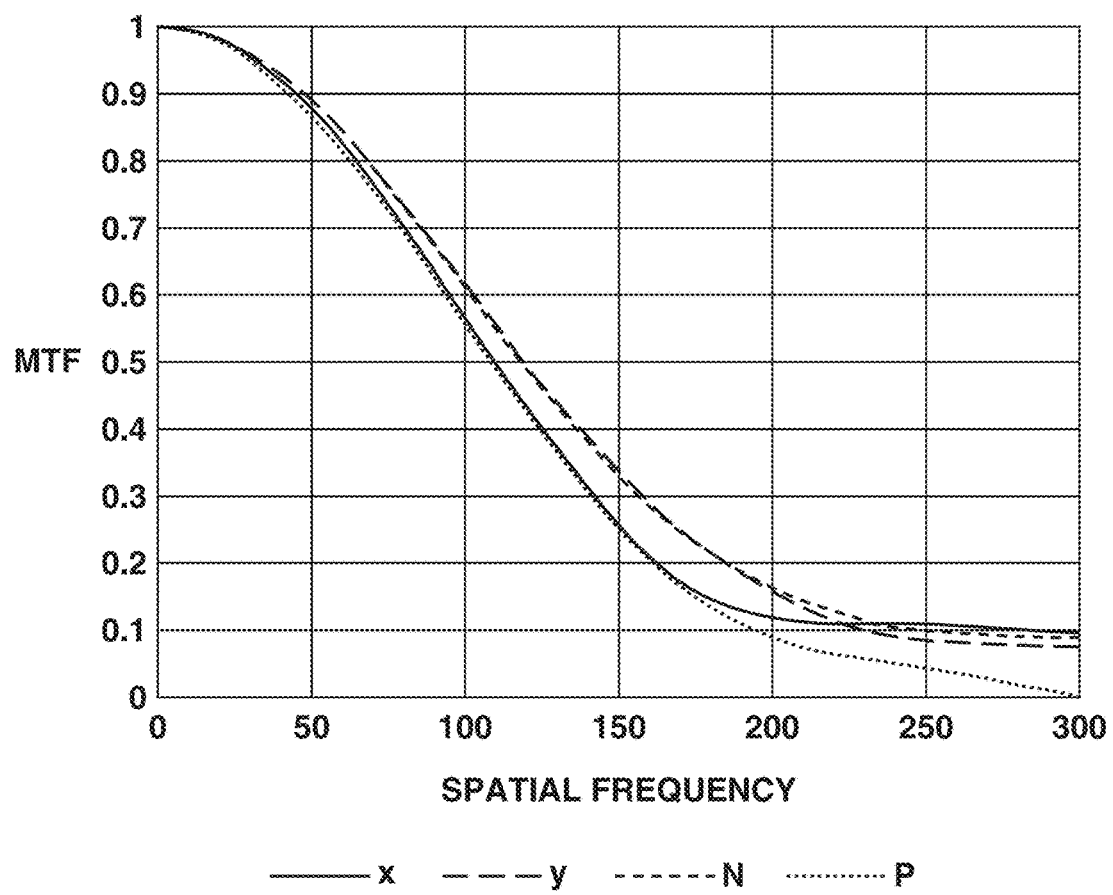
FIG. 9 is a chart illustrating a spatial frequency characteristic of the first comparative example.

FIG. 7 illustrates a point image intensity distribution of the first comparative example, and FIG. 9 an MTF graph. The point image distribution according to the first comparative example is uneven in part near the center. This results in higher MTFs in the horizontal direction (x) and the −45° direction (N). The reason is that the point image distributions projected in the horizontal direction (x) and the −45° direction (N) have a distribution shape concentrated on the center portion, compared to the design values. The MTFs, on the whole, do not fall sufficiently in a high frequency range of 200 lp/mm or more. As a result, color moiré can increase in a specific direction. Folding moiré can occur at high frequencies.

According to the present exemplary embodiment, the point image distribution of the multi-point separation optical low-pass filter can be uniformized. An optical low-pass filter having a highly symmetric point image distribution close to design values can thus be obtained.

An optical low-pass filter according to a second exemplary embodiment (second numerical example) of the present invention will be described. Table 3 illustrates a configuration of the optical low-pass filter according to the present exemplary embodiment. In the present exemplary embodiment, the LPF1 to LPF4 have a ray separation width as small as 1.50 µm, compared to the first exemplary embodiment. The LPF1 to LPF4 have a ray separation direction of 45°, 180°, 315°, and 90°, respectively, with respect to the x direction. The LPF1 to LPF4 all have the same ray separation width of 1.75 µm.

The distance Ds is 0.725 µm, which is equivalent to 0.138 Da and satisfies the conditional expression (1). A difference between the values of the phase differences occurring in each LPF at the shortest wavelength 460 nm and the longest wavelength 640 nm of the use wavelength range, divided by 460 nm and 640 nm is 0.798. The conditional expression (2) is thus satisfied.

Figure 10:
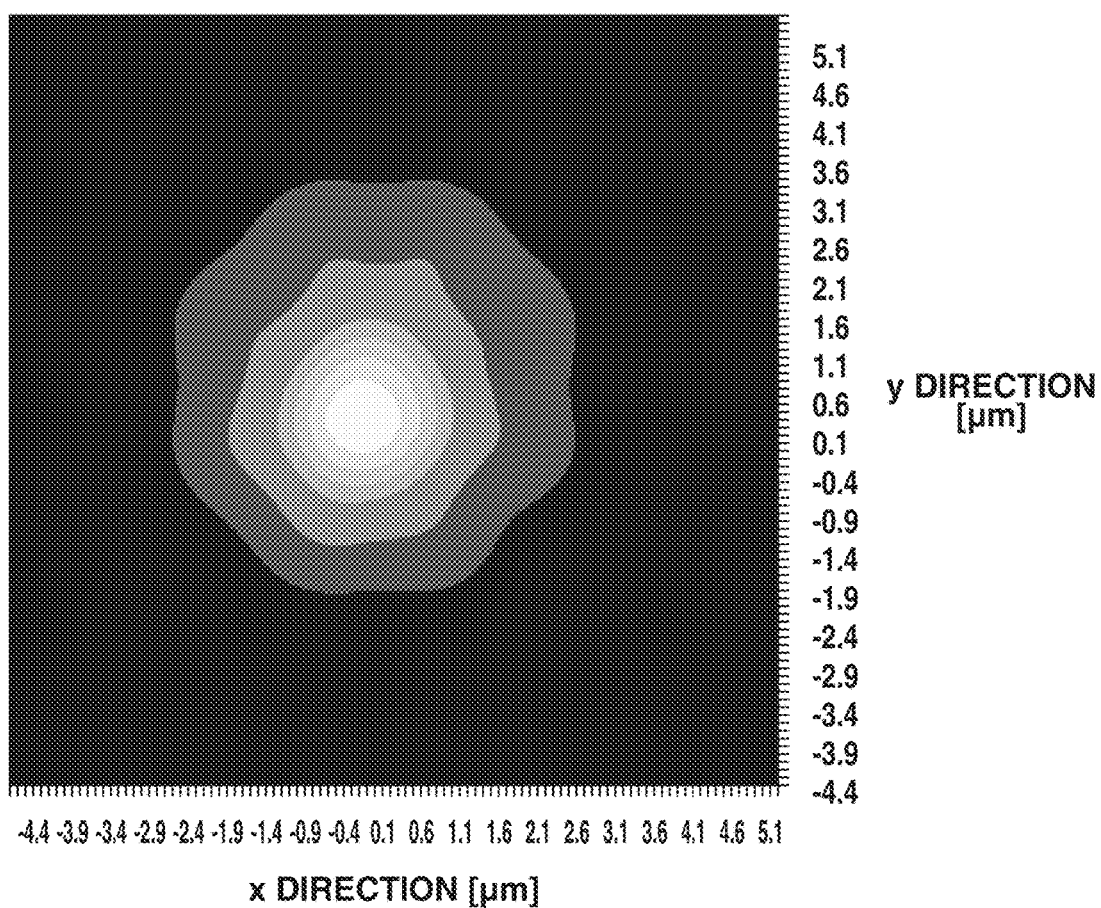
FIG. 10 is a point image distribution diagram of an optical low-pass filter that is a second exemplary embodiment of the present invention.

FIG. 10 illustrates a point image intensity distribution of the optical low-pass filter according to the present exemplary embodiment. The point image intensity distribution indicates the distribution at the focal position when a light flux equivalent to F2.0 is incident on the optical low-pass filter. The point images are closer to each other than in the first exemplary embodiment. The point image intensity distribution approaches the shape of a uniform Gaussian distribution because of interference between the point images.

Figure 11:
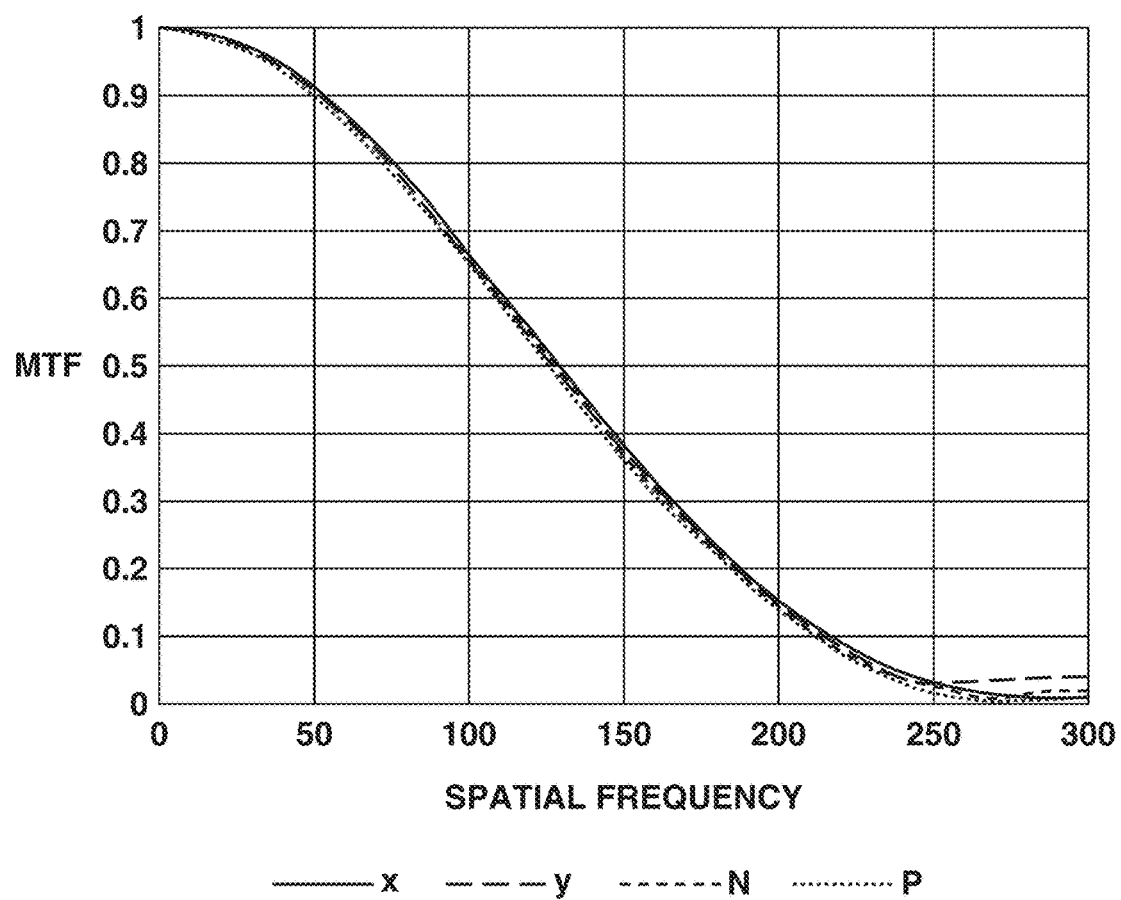
FIG. 11 is a chart illustrating a spatial frequency characteristic of the second exemplary embodiment.

FIG. 11 illustrates a spatial frequency characteristic (MTF) of the point images of FIG. 10. The MTFs illustrated by the four lines in FIG. 11 have the same meanings as in the first exemplary embodiment. The MTFs according to the present exemplary embodiment have a symmetric distribution in all directions. The optical low-pass filter according to the present exemplary embodiment has a Nyquist frequency Fn of approximately 150/mm. Perceived horizontal and vertical resolutions can thus be enhanced with moderate suppression of color moiré occurring in the diagonal directions.

An optical low-pass filter according to a third exemplary embodiment (third numerical example) of the present invention will be described. Table 4 illustrates a configuration of the optical low-pass filter according to the present exemplary embodiment. In the present exemplary embodiment, the LPF1 to LPF4 have a ray separation width as large as 3.03 µm, compared to the first exemplary embodiment. The LPF1 to LPF4 have a ray separation direction of 135°, 0°, 225°, and 90°, respectively, with respect to the x direction. The LPF1 to LPF4 all have the same ray separation width of 3.03 µm.

The distance Ds is 1.255 µm, which is equivalent to 0.138 Da and satisfies the conditional expression (1). A difference between the values of the phase differences occurring in each LPF at the shortest wavelength 460 nm and the longest wavelength 640 nm of the use wavelength range, divided by 460 nm and 640 nm is 1.613. The conditional expression (2) is thus satisfied.

Figure 12:
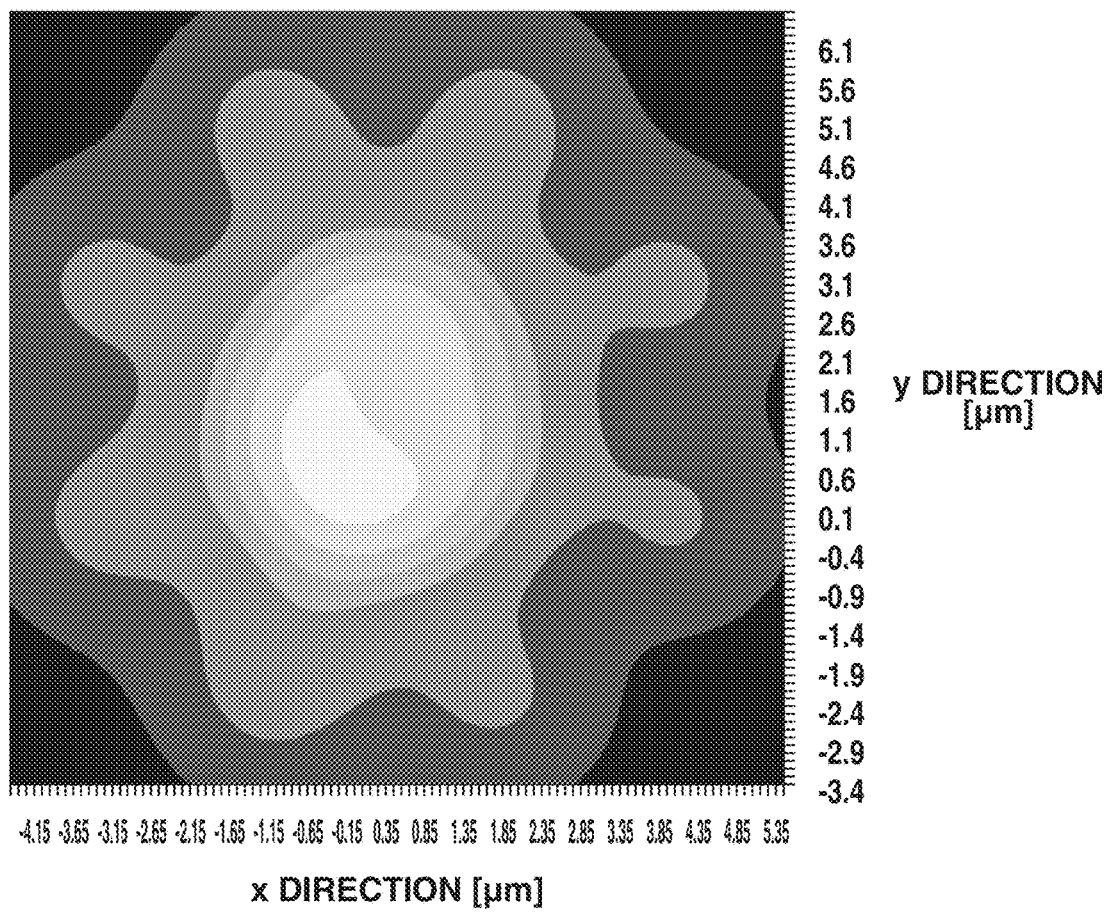
FIG. 12 is a point image distribution diagram of an optical low-pass filter that is a third exemplary embodiment of the present invention.

FIG. 12 illustrates a point image intensity distribution of the optical low-pass filter according to the present exemplary embodiment. The point image intensity distribution indicates the distribution at the focal position when a light flux equivalent to F4.0 is incident on the optical low-pass filter. The point image distribution is slightly uneven, but highly symmetrical and uniform.

Figure 13:
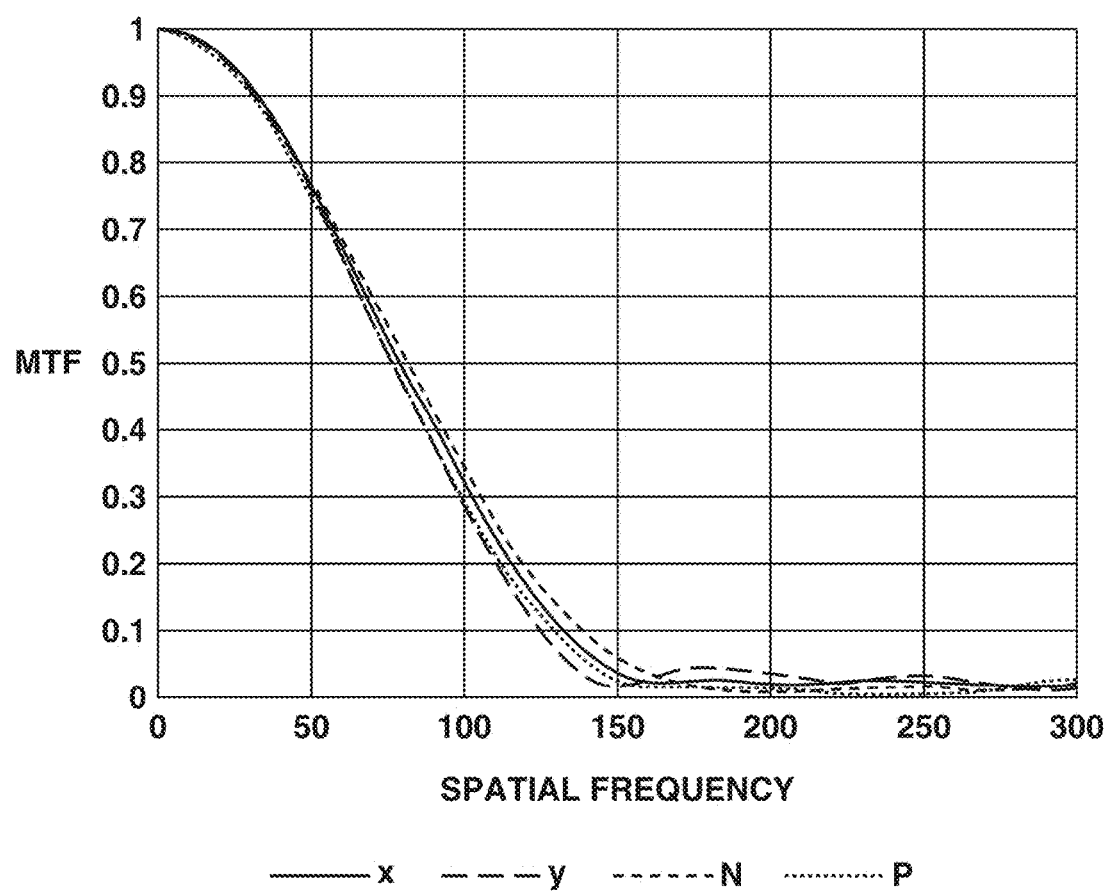
FIG. 13 is a chart illustrating a spatial frequency characteristic of the third exemplary embodiment.

FIG. 13 illustrates a spatial frequency characteristic (MTF) of the point images of FIG. 12. The MTFs illustrated by the four lines in FIG. 13 have the same meanings as in the first exemplary embodiment. The MTFs according to the present exemplary embodiment have a symmetric distribution in all directions. The MTFs are uniformly suppressed up to the high frequency range. The optical low-pass filter according to the present exemplary embodiment has a Nyquist frequency Fn of approximately 80/mm. Perceived horizontal and vertical resolutions can thus be enhanced with moderate suppression of color moiré occurring in the diagonal directions.

Figure 14:
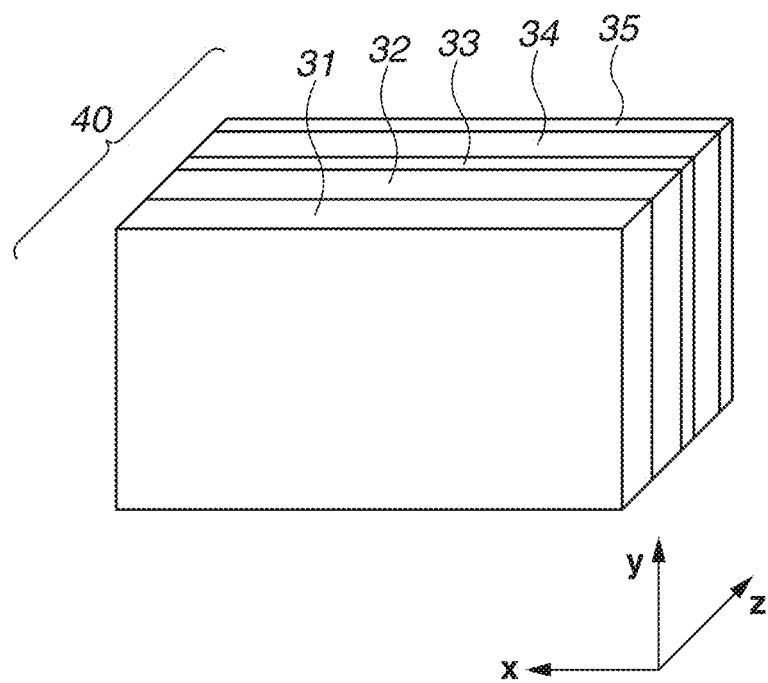
FIG. 14 is a diagram illustrating a configuration of an optical low-pass filter that is a fourth exemplary embodiment of the present invention.

An optical low-pass filter according to a fourth exemplary embodiment (fourth numerical example) of the present invention will be described. FIG. 14 and Table 5 illustrate a configuration of the optical low-pass filter according to the present exemplary embodiment. As illustrated in FIG. 14, an optical low-pass filter 40 according to the present exemplary embodiment is constituted by stacking five LPFs, or LPF31 to LPF35, each made of rock crystal in this order in the optical axis direction. The LPF31 to LPF35 have a ray separation direction of 180°, 45°, 90°, 315°, and 90°, respectively, with respect to the x direction. The LPF31 and LPF35 have the same ray separation direction. The LPF31 and LPF35 have a ray separation width (1.32 µm) one half that (2.64 µm) of the other LPF32 to LPF34.

The optical low-pass filter 40 according to the present exemplary embodiment includes the five LPFs LPF31 to LPF35 and are originally configured to separate an incident ray into 32 points. Of these, eight points are superposed on the same positions, so that the optical low-pass filter 40 is a 24-point separation optical low-pass filter. A geometrical optical point image distribution is not exactly identical between the x direction and the y direction. The ray separation width is the same in the x direction and the y direction.

In the present exemplary embodiment, Ds is 1.714 µm, which is equivalent to 0.186 Da and satisfies the conditional expression (1). As for the conditional expression (2), the LPF31, LPF32, and LPF34 have a value of 1.404, and the LPF33 and LPF35 a value of 0.701. The conditional expression (2) is thus satisfied.

Figure 15:
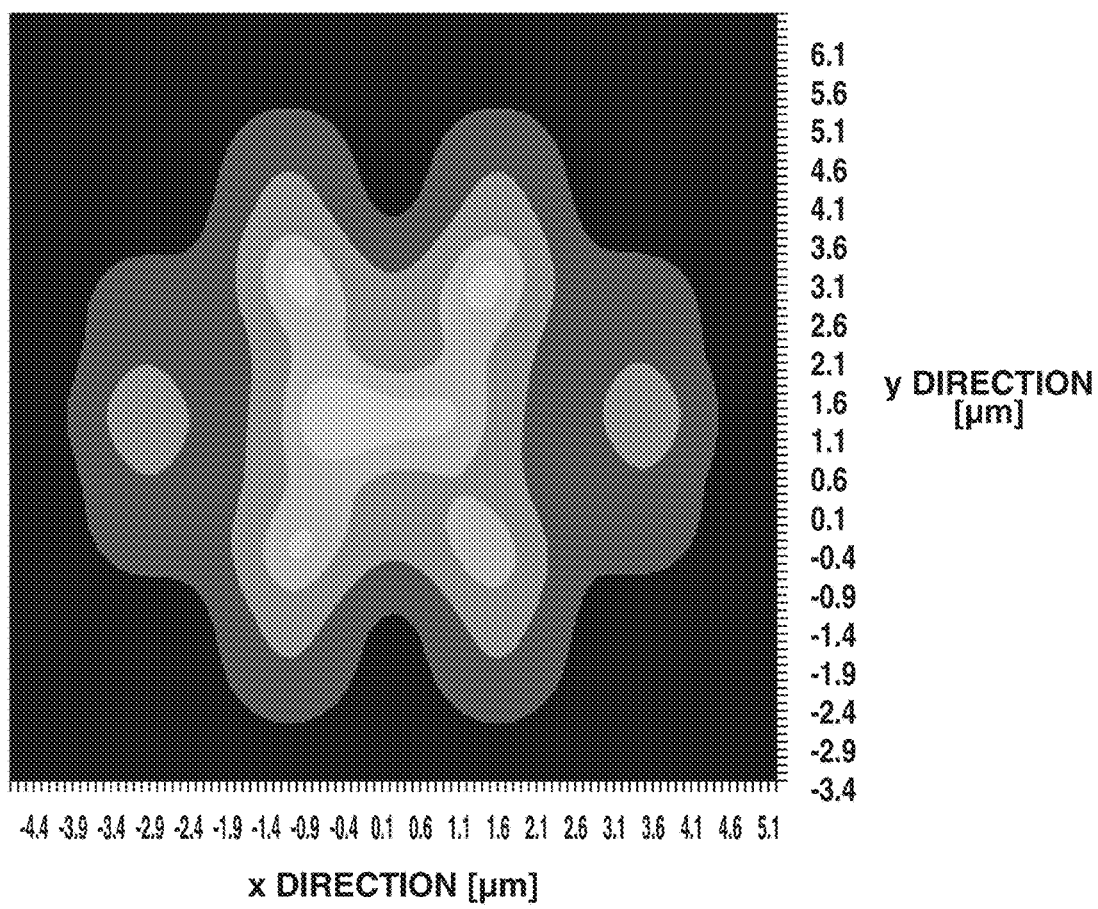
FIG. 15 is a point image distribution diagram of the optical low-pass filter according to the fourth exemplary embodiment.

FIG. 15 illustrates a point image intensity distribution of the optical low-pass filter 40 according to the present exemplary embodiment. The point image intensity distribution indicates the distribution at the focal position when a light flux equivalent to F2.0 is incident on the optical low-pass filter 40. The point image distribution is slightly uneven, but highly symmetrical and uniform.

Figure 16:
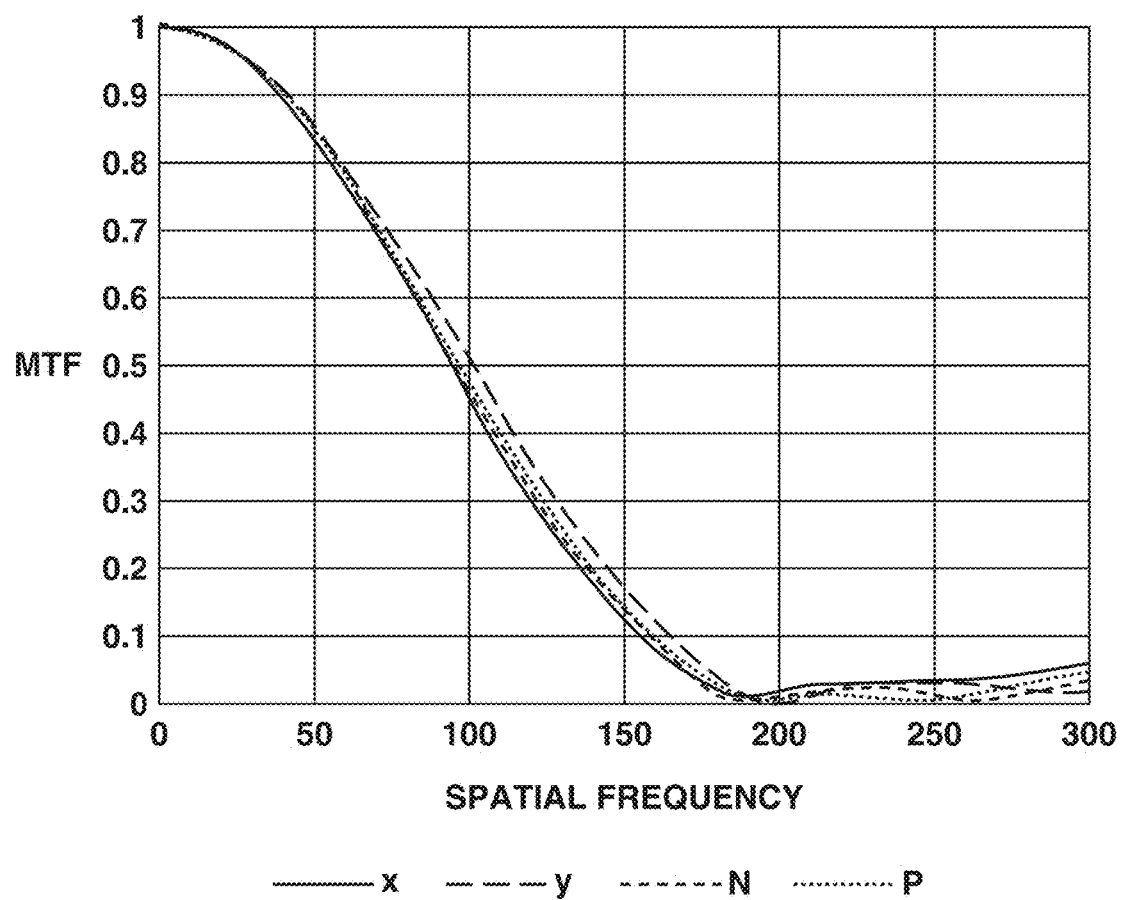
FIG. 16 is a chart illustrating a spatial frequency characteristic of the fourth exemplary embodiment.

FIG. 16 illustrates a spatial frequency characteristic (MTF) of the point images of FIG. 15. The MTFs illustrated by the four lines in FIG. 16 have the same meanings as in the first exemplary embodiment. As described above, the number of times of ray separation is different between the x direction and the y direction. The point image distribution according to the present exemplary embodiment is therefore not geometrically optically identical in the two directions. However, the MTFs in the four directions have a relatively symmetric distribution in a region where interference between point images has a high impact. According to the present exemplary embodiment, an optical low-pass filter with a highly symmetric, uniform point image distribution can thus be obtained.

Figure 17:
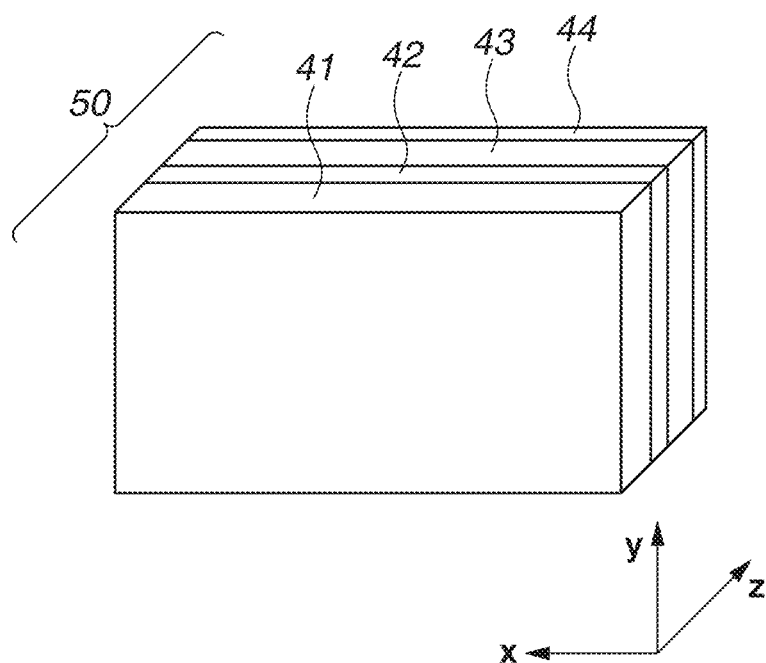
FIG. 17 is a diagram illustrating a configuration of an optical low-pass filter that is a fifth exemplary embodiment of the present invention.

An optical low-pass filter according to a fifth exemplary embodiment (fifth numerical example) of the present invention will be described. FIG. 17 and Table 6 illustrate a configuration of an optical low-pass filter 50 according to the present exemplary embodiment. The optical low-pass filter 50 according to the present exemplary embodiment includes second and fourth LPFs LPF42 and LPF44, which perform point image separation with a ray separation width of Db in the y direction and the x direction, respectively, and first and third LPFs LPF41 and LPF43, which perform point image separation with a ray separation width of Dc (Dc>Db) in respective diagonal directions. The first to fourth LPFs LPF41, LPF42, LPF43, and LPF44 are alternately stacked in this order in the optical axis direction.

The first to fourth LPFs LPF41, LPF42, LPF43, and LPF44 have a ray separation direction of 45°, 180°, 315°, and 90°, respectively, with respect to the x direction. The second and fourth LPFs LPF42 and LPF44 are made of rock crystal. The first and third LPFs LPF41 and LPF43 are made of lithium niobate ($NbLiO_3$). The second and fourth LPFs LPF42 and LPF44 have a ray separation width of 1.73 µm. The first and third LPFs LPF41 and LPF43 have a ray separation width of 3.48 µm.

The distance Ds is 3.191 µm, which is equivalent to 0.367 Da and satisfies the conditional expression (1). A difference between the values of the phase differences occurring in at least one LPF, or the second and fourth LPFs LPF2 and LPF4 here, at the shortest wavelength 460 nm and the longest wavelength 640 nm of the use wavelength range, divided by 460 nm and 640 nm is approximately 1.038. The conditional expression (2) is thus satisfied.

Figure 18:
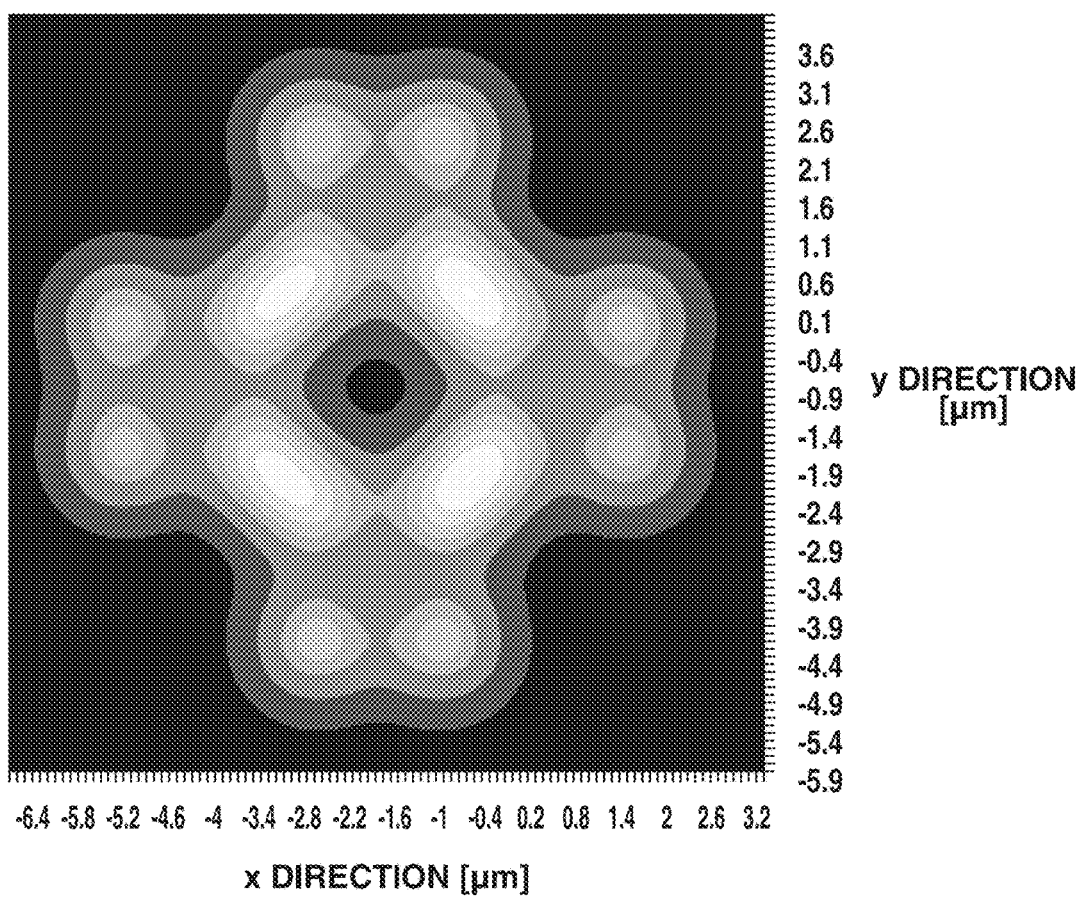
FIG. 18 is a point image distribution diagram of the optical low-pass filter according to the fifth exemplary embodiment.

FIG. 18 illustrates a point image intensity distribution of the optical low-pass filter 50 according to the present exemplary embodiment. The point image intensity distribution indicates the distribution at the focal position when a light flux equivalent to F4.0 is incident on the optical low-pass filter 50. The optical low-pass filter 50 according to the present exemplary embodiment is configured so that the ray separation width in the horizontal and vertical directions is different from that in the diagonal directions, whereby the suppression of diagonal color moiré is achieved in a manner compatible with the perceived horizontal and vertical resolutions. Both the MTFs in the horizontal and vertical directions and those in the two diagonal directions have a uniform distribution.

Figure 19:
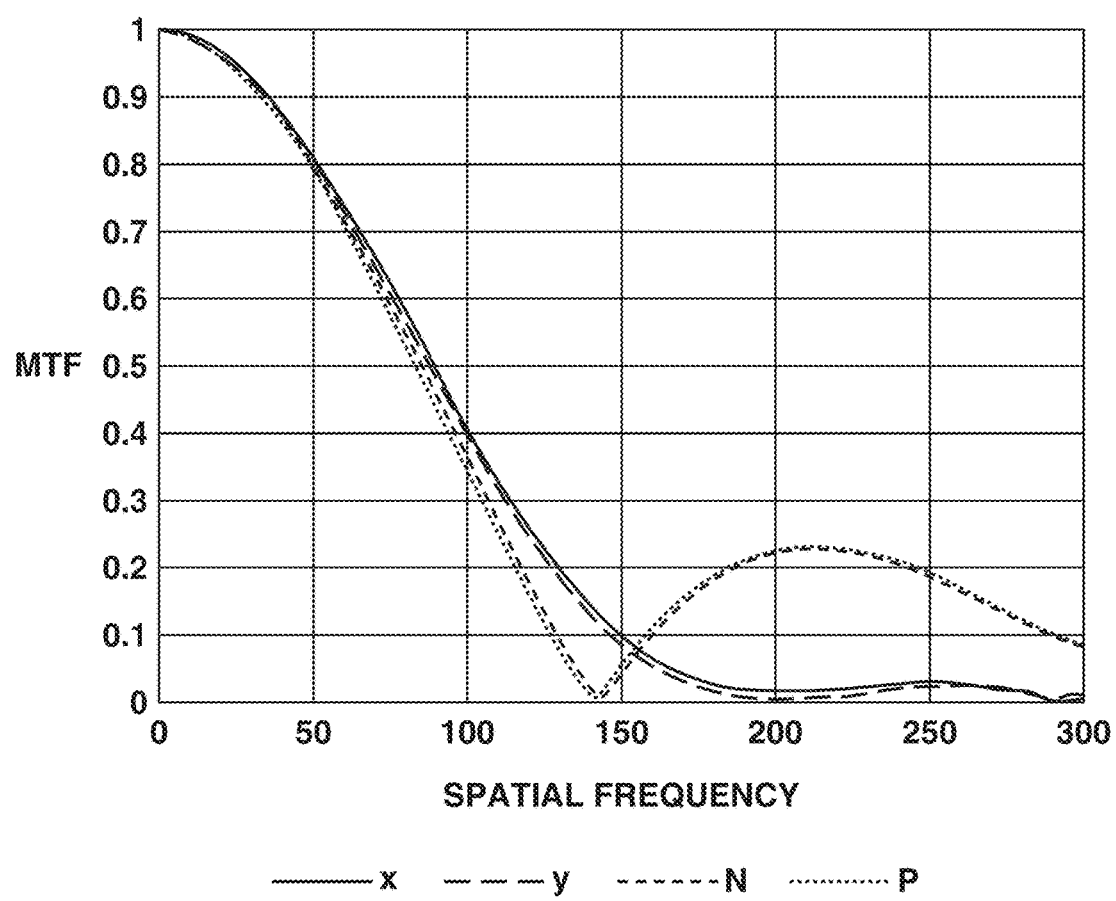
FIG. 19 is a chart illustrating a spatial frequency characteristic of the fifth exemplary embodiment.

FIG. 19 illustrates a spatial frequency characteristic (MTF) of the point images of FIG. 18. Among the MTFs illustrated by the four lines in the chart, the MTFs corresponding to the horizontal and vertical components have a tendency to fall smoothly over high frequencies. The MTFs of the diagonal components are configured to drop near 140 lp/mm so that false color occurring in this vicinity can be suppressed while the horizontal and vertical resolutions are maintained up to high frequencies. The MTFs of the diagonal components are folded at 220 lp/mm but are still suppressed low, compared to, for example, typical four-point separation.

Figure 20:
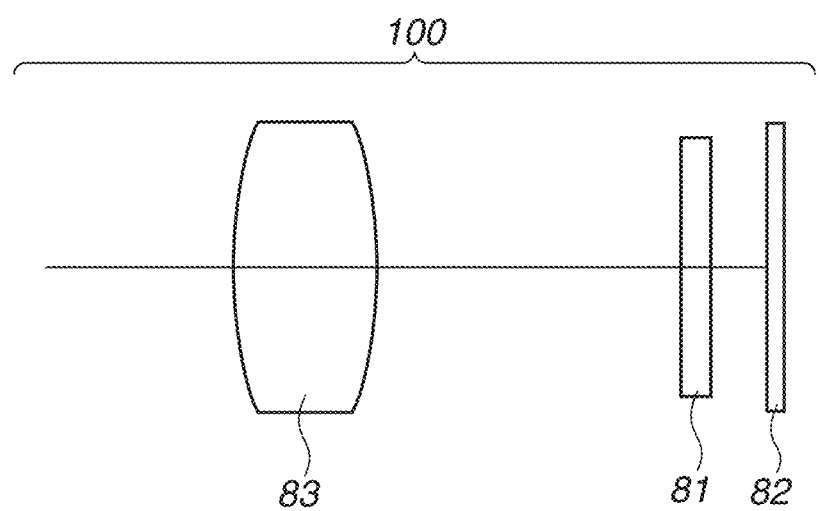
FIG. 20 is a diagram illustrating an imaging apparatus which is a sixth exemplary embodiment of the present invention.

FIG. 20 illustrates a configuration of an imaging apparatus 100 which is a sixth exemplary embodiment of the present invention. The imaging apparatus 100 includes an optical low-pass filter 81 according to any one of the foregoing first to fifth exemplary embodiments, an imaging optical system 83, and an image sensor 82. The optical low-pass filter 81 is arranged between the imaging optical system 83 and the image sensor 82. A light flux passed through the imaging optical system 83 and further passed through the optical low-pass filter 81 forms an optical image on the image sensor 82. The image sensor 82 photoelectrically converts the optical image to generate an image signal.

The image sensor 82 includes a pixel array of Bayer arrangement, including red (R), green (G), and blue (B) pixels, in which color moiré is likely to occur in a spatial high-frequency region in diagonal (oblique) directions in particular. Luminance moiré from the aliasing in the high frequency region may also occur. In view of such problems, a favorable suppression effect on color moiré and luminance moiré can be provided in each of the diagonal, horizontal, and vertical directions by using the optical low-pass filter 81 according to any one of the first to fifth exemplary embodiments. The configuration of the optical low-pass filter 81 can be appropriately selected according to the pixel pitch of the image sensor 82 and the configuration of the imaging apparatus 100.

The exemplary embodiments described above are merely representative examples. In carrying out the present invention, various changes and modifications may be made to the exemplary embodiments.

For example, the LPFs may be a combination of different materials such as rock crystal and lithium niobate. The number of layers may be six or more according to allowable thicknesses and costs. The greater the number of layers, the smoother the entire point image distribution but the greater the effect of interference. An optical low-pass filter with a highly symmetric, uniform point image distribution can be obtained by satisfying the foregoing conditional expressions.

While the strength of an optical low-pass filter is proportional to the ray separation width, the cutoff spatial frequency can also be controlled by the entire ray separation width being scaled. The entire cutoff frequency including those of the horizontal and oblique directions can be shifted. To perform independent controls on the horizontal and oblique directions, oblique separation and horizontal separation of point images can be individually controlled. The ray separation widths are desirably selected as appropriate according to the frequency range and orientations to suppress.

TABLE 1

(First Exemplary Embodiment)

| First Exemplary Embodiment | Material | Ray Separation Direction [deg] | Ray Separation Width [μm] | Phase Difference [nm] @460 nm | Phase Difference [nm] @550 nm | Phase Difference [nm] @640 nm |
|---|---|---|---|---|---|---|
| LPF1 | Rock crystal | 45 | 2.10 | 1670 | 1631 | 1608 |
| LPF2 | Rock crystal | 180 | 2.10 | 1670 | 1631 | 1608 |
| LPF3 | Rock crystal | 315 | 2.10 | 1670 | 1631 | 1608 |
| LPF4 | Rock crystal | 90 | 2.10 | 1670 | 1631 | 1608 |

TABLE 2

(First Comparative Example)

| First Comparative Example | Material | Ray Separation Direction [deg] | Ray Separation Width [μm] | Phase Difference [nm] @460 nm | Phase Difference [nm] @550 nm | Phase Difference [nm] @640 nm |
|---|---|---|---|---|---|---|
| LPF1' | Rock crystal | 45 | 2.10 | 1670 | 1631 | 1608 |
| LPF2' | Rock crystal | 0 | 2.10 | 1670 | 1631 | 1608 |
| LPF3' | Rock crystal | 315 | 2.10 | 1670 | 1631 | 1608 |
| LPF4' | Rock crystal | 270 | 2.10 | 1670 | 1631 | 1608 |

TABLE 3

(Second Exemplary Embodiment)

| Second Exemplary Embodiment | Material | Ray Separation Direction [deg] | Ray Separation Width [μm] | Phase Difference [nm] @460 nm | Phase Difference [nm] @550 nm | Phase Difference [nm] @640 nm |
|---|---|---|---|---|---|---|
| LPF1 | Rock crystal | 45 | 1.75 | 1193 | 1165 | 1149 |
| LPF2 | Rock crystal | 180 | 1.75 | 1193 | 1165 | 1149 |

TABLE 3-continued (Second Exemplary Embodiment)

| Second Exemplary Embodiment | Material | Ray Separation Direction [deg] | Ray Separation Width [μm] | Phase Difference [nm] @460 nm | Phase Difference [nm] @550 nm | Phase Difference [nm] @640 nm |
|---|---|---|---|---|---|---|
| LPF3 | Rock crystal | 315 | 1.75 | 1193 | 1165 | 1149 |
| LPF4 | Rock crystal | 90 | 1.75 | 1193 | 1165 | 1149 |

TABLE 4

(Third Exemplary Embodiment)

| Third Exemplary Embodiment | Material | Ray Separation Direction [deg] | Ray Separation Width [μm] | Phase Difference [nm] @460 nm | Phase Difference [nm] @550 nm | Phase Difference [nm] @640 nm |
|---|---|---|---|---|---|---|
| LPF1 | Rock crystal | 135 | 3.03 | 2410 | 2354 | 2321 |
| LPF2 | Rock crystal | 0 | 3.03 | 2410 | 2354 | 2321 |
| LPF3 | Rock crystal | 225 | 3.03 | 2410 | 2354 | 2321 |
| LPF4 | Rock crystal | 90 | 3.03 | 2410 | 2354 | 2321 |

TABLE 5

(Fourth Exemplary Embodiment)

| Fourth Exemplary Embodiment | Material | Ray Separation Direction [deg] | Ray Separation Width [μm] | Phase Difference [nm] @460 nm | Phase Difference [nm] @550 nm | Phase Difference [nm] @640 nm |
|---|---|---|---|---|---|---|
| LPF31 | Rock crystal | 180 | 2.64 | 2099 | 2051 | 2022 |
| LPF32 | Rock crystal | 45 | 2.64 | 2099 | 2051 | 2022 |
| LPF33 | Rock crystal | 90 | 1.32 | 1049 | 1025 | 1011 |
| LPF34 | Rock crystal | 315 | 2.64 | 2099 | 2051 | 2022 |
| LPF35 | Rock crystal | 90 | 1.32 | 1049 | 1025 | 1011 |

TABLE 6

(Fifth Exemplary Embodiment)

| Fifth Exemplary Embodiment | Material | Ray Separation Direction [deg] | Ray Separation Width [μm] | Phase Difference [nm] @460 nm | Phase Difference [nm] @550 nm | Phase Difference [nm] @640 nm |
|---|---|---|---|---|---|---|
| LPF41 | $LiNbO_3$ | 45 | 3.48 | 12967 | 11828 | 11346 |
| LPF42 | Rock crystal | 180 | 1.73 | 1552 | 1516 | 1495 |
| LPF43 | $LiNbO_3$ | 315 | 3.48 | 12967 | 11828 | 11346 |
| LPF44 | Rock crystal | 90 | 1.73 | 1552 | 1516 | 1495 |

Table 7 illustrates the values of the conditional expressions in the exemplary embodiments. For the fourth and fifth exemplary embodiments, the numerical values of the respective materials of the birefringent optical elements are separately listed in upper and lower rows. As for the conditional expression (3), values related to the phase differences δs at respective wavelengths are listed. As illustrated in Table 7, all the exemplary embodiments satisfy the conditional expression (3).

TABLE 7

|  | Conditional Expression (1) | Conditional Expression (2) | Conditional Expression (3) | | |
|---|---|---|---|---|---|
| First Exemplary Embodiment | Ds = 0.870 (= 0.138 Da) | 1.118 | 1.021 | 0.997 | 0.983 |
| First Comparative Example | Ds = 5.070 (= 0.805 Da) | 1.118 | 1.021 | 0.997 | 0.983 |
| Second Exemplary Embodiment | Ds = 0.725 (= 0.138 Da) | 0.798 | 0.729 | 0.712 | 0.703 |
| Third Exemplary Embodiment | Ds = 1.255 (= 0.138 Da) | 1.613 | 1.474 | 1.439 | 1.419 |
| Fourth Exemplary Embodiment | Ds = 1.714 (= 0.186 Da) | 1.404 0.701 | 1.283 0.641 | 1.254 0.627 | 1.236 0.618 |
| Fifth Exemplary Embodiment | Ds = 3.191 (= 0.367 Da) | 10.461 1.038 | 7.928 0.949 | 7.232 0.927 | 6.937 0.914 |

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2018-132675, filed Jul. 12, 2018, and No. 2017-155673, filed Aug. 10, 2017, which are hereby incorporated by reference herein in their entirety.

What is claimed is:

1. An optical low-pass filter comprising a stack of N ($5 \geq N \geq 3$) optical anisotropic layers each configured to separate an incident ray into a plurality of rays,
wherein the following condition is satisfied:

$$Ds \leq 0.50\ Da,$$

where Da [μm] is a total value of ray separation widths of the first to (N−1)th optical anisotropic layers among the N optical anisotropic layers, and Ds [μm] is a distance between a ray having a maximum phase difference and a ray having a minimum phase difference among the rays separated by the first to (N−1)th optical anisotropic layers.

2. The optical low-pass filter according to claim 1, wherein the following condition is satisfied:

$$0.5 \leq \delta min/\lambda min - \delta max/\lambda max,$$

where $\lambda min$ and $\lambda max$ are a shortest wavelength and a longest wavelength in a wavelength range in which the optical low-pass filter is used, respectively, and $\delta min$ and $\delta max$ are optical path differences occurring in at least one of the first to (N−1)th optical anisotropic layers at the shortest wavelength $\lambda min$ and the longest wavelength $\lambda max$, respectively.

3. The optical low-pass filter according to claim 1, wherein the following condition is satisfied:

$$0.5 \leq \delta s/\lambda min - \delta s/\lambda max,$$

where $\lambda min$ and $\lambda max$ are a shortest wavelength and a longest wavelength in a wavelength range in which the optical low-pass filter is used, respectively, and $\delta s$ is an optical path difference occurring in at least one of the N optical anisotropic layers.

4. The optical low-pass filter according to claim 1, wherein an angle formed between ray separation directions of two adjacent optical anisotropic layers among the N optical anisotropic layers is 120° or more and no more than 150°.

5. The optical low-pass filter according to claim 1, wherein all the N optical anisotropic layers have the same ray separation width.

6. The optical low-pass filter according to claim 5, wherein the following equation is satisfied:

$$\Delta nd = m \times \lambda a,$$

where $\Delta nd$ [nm] is an optical path difference occurring in at least one of the second to (N−1)th optical anisotropic layers at a wavelength $\lambda a$ longer than a shortest wavelength $\lambda min$ and shorter than a longest wavelength $\lambda max$ in a wavelength range in which the optical low-pass filter is used, and m is a natural number.

7. The optical low-pass filter according to claim 1,
wherein the N optical anisotropic layers include alternately-stacked first and second optical anisotropic layers,
wherein the first optical anisotropic layer separates the incident ray in a first direction or a second direction orthogonal to the first direction, and
wherein the second optical anisotropic layer separates the incident ray in a direction of 45° or 135° with respect to the first or second direction.

8. The optical low-pass filter according to claim 7, wherein the ray separation width of the first optical anisotropic layer is smaller than that of the second optical anisotropic layer.

9. The optical low-pass filter according to claim 7, wherein the following equation is satisfied:

$$\Delta nd = (m+0.5)/2 \times \lambda a,$$

where $\Delta nd$ [nm] is optical path difference occurring in the second optical anisotropic layer at a wavelength $\lambda a$ longer than a shortest wavelength $\lambda min$ and shorter than a longest wavelength $\lambda max$ in a wavelength range in which the optical low-pass filter is used, and m is a natural number.

10. The optical low-pass filter according to claim 1, comprising a stack of four optical anisotropic layers.

11. The optical low-pass filter according to claim 1, wherein the following condition is satisfied:

$$Ds \leq 4.2.$$

12. The optical low-pass filter according to any one of claim 1, wherein the following condition is satisfied:

$$Ds \leq 0.4\ Da.$$

13. The optical low-pass filter according to claim 1, wherein the following condition is satisfied:

$$0.5 \leq \delta min/\lambda min - \delta max/\lambda max \leq 3.0,$$

where $\lambda min$ and $\lambda max$ are a shortest wavelength and a longest wavelength in a wavelength range in which the optical low-pass filter is used, respectively, and $\delta min$ and $\delta max$ are optical path differences occurring in at least one of the first to (N−1)th optical anisotropic layers at the shortest wavelength $\lambda min$ and the longest wavelength $\lambda max$, respectively.

14. The optical low-pass filter according to claim 1, wherein the following condition is satisfied:

$$0.5 \leq \delta s/\lambda min - \delta s/\lambda max \leq 10.0,$$

where λmin and λmax are a shortest wavelength and a longest wavelength in a wavelength range in which the optical low-pass filter is used, respectively, and δs is an optical path difference occurring in at least one of the N optical anisotropic layers.

15. An imaging apparatus comprising:
- the optical low-pass filter according to claim 1; and
- an image sensor configured to photoelectrically convert an optical image formed by light passed through the optical low-pass filter.

* * * * *